United States Patent
Choi et al.

(10) Patent No.: US 10,593,557 B2
(45) Date of Patent: Mar. 17, 2020

(54) METHODS OF MANUFACTURING A SEMICONDUCTOR DEVICE

(71) Applicant: SAMSUNG ELECTRONICS CO., LTD., Suwon-si, Gyeonggi-do (KR)

(72) Inventors: Kyung-In Choi, Seoul (KR); Sang-Hoon Han, Seoul (KR); Sun-Jung Kim, Suwon-si (KR); Tae-Gon Kim, Seoul (KR); Hyun-Chul Song, Seoul (KR)

(73) Assignee: Samsung Electronics Co., Ltd., Suwon-si, Gyoenggi-do (KR)

( * ) Notice: Subject to any disclaimer, the term of this patent is extended or adjusted under 35 U.S.C. 154(b) by 0 days.

(21) Appl. No.: 16/123,262

(22) Filed: Sep. 6, 2018

(65) Prior Publication Data
US 2019/0164776 A1   May 30, 2019

(30) Foreign Application Priority Data

Nov. 27, 2017   (KR) .......................... 10-2017-0159654

(51) Int. Cl.
*H01L 21/4763* (2006.01)
*H01L 21/3115* (2006.01)
(Continued)

(52) U.S. Cl.
CPC .. *H01L 21/31155* (2013.01); *H01L 21/02164* (2013.01); *H01L 21/265* (2013.01);
(Continued)

(58) Field of Classification Search
CPC ......... H01L 21/31155; H01L 29/66545; H01L 21/823481; H01L 21/02164; H01L 21/31116; H01L 21/265
(Continued)

(56) References Cited

U.S. PATENT DOCUMENTS

| | | | |
|---|---|---|---|
| 6,365,525 | B2 | 4/2002 | Müller |
| 8,421,139 | B2 * | 4/2013 | Kanakasabapathy ....................... H01L 21/845 257/296 |

(Continued)

FOREIGN PATENT DOCUMENTS

| | | |
|---|---|---|
| JP | 11-297635 A | 10/1999 |
| JP | 2000-012519 A | 1/2000 |

(Continued)

*Primary Examiner* — Vu A Vu
(74) *Attorney, Agent, or Firm* — Lee IP Law, PC

(57) ABSTRACT

A method of manufacturing a semiconductor device, the method including forming dummy gate structures on a substrate; forming spacers on sidewalls of the dummy gate structures; forming a preliminary first interlayer insulation pattern to fill a gap between adjacent spacers; etching an upper portion of the preliminary first interlayer insulation pattern through a first etching process to form a preliminary second interlayer insulation pattern; implanting an ion on the dummy gate structures, the spacers, and the preliminary second interlayer insulation pattern through an ion-implanting process; etching an upper portion of the preliminary second interlayer insulation pattern through a second etching process to form an interlayer insulation pattern having a flat upper surface; and forming a capping pattern on the interlayer insulation pattern to fill a gap between the spacers.

18 Claims, 32 Drawing Sheets

(51) Int. Cl.
  *H01L 29/66* (2006.01)
  *H01L 21/02* (2006.01)
  *H01L 21/311* (2006.01)
  *H01L 21/265* (2006.01)
  *H01L 21/8234* (2006.01)
  *H01L 29/78* (2006.01)

(52) U.S. Cl.
  CPC ............... *H01L 21/31116* (2013.01); *H01L 21/823437* (2013.01); *H01L 21/823481* (2013.01); *H01L 29/66545* (2013.01); *H01L 29/785* (2013.01); *H01L 21/3115* (2013.01); *H01L 21/823475* (2013.01)

(58) Field of Classification Search
  USPC ....................................................... 438/586
  See application file for complete search history.

(56) References Cited

U.S. PATENT DOCUMENTS

| | | | |
|---|---|---|---|
| 9,190,498 B2 | 11/2015 | Brand et al. | |
| 9,281,307 B2* | 3/2016 | Huang | H01L 27/088 |
| 9,634,141 B1 | 4/2017 | Wang et al. | |
| 9,698,229 B2* | 7/2017 | Liao | H01L 21/823871 |
| 2012/0001263 A1* | 1/2012 | Richter | H01L 21/31053 |
| | | | 257/368 |
| 2015/0295089 A1* | 10/2015 | Huang | H01L 29/7853 |
| | | | 257/401 |

FOREIGN PATENT DOCUMENTS

| | | |
|---|---|---|
| KR | 10-1994-0001282 A | 1/1994 |
| KR | 10-2008-0001373 A | 1/2008 |

\* cited by examiner

FIG. 1
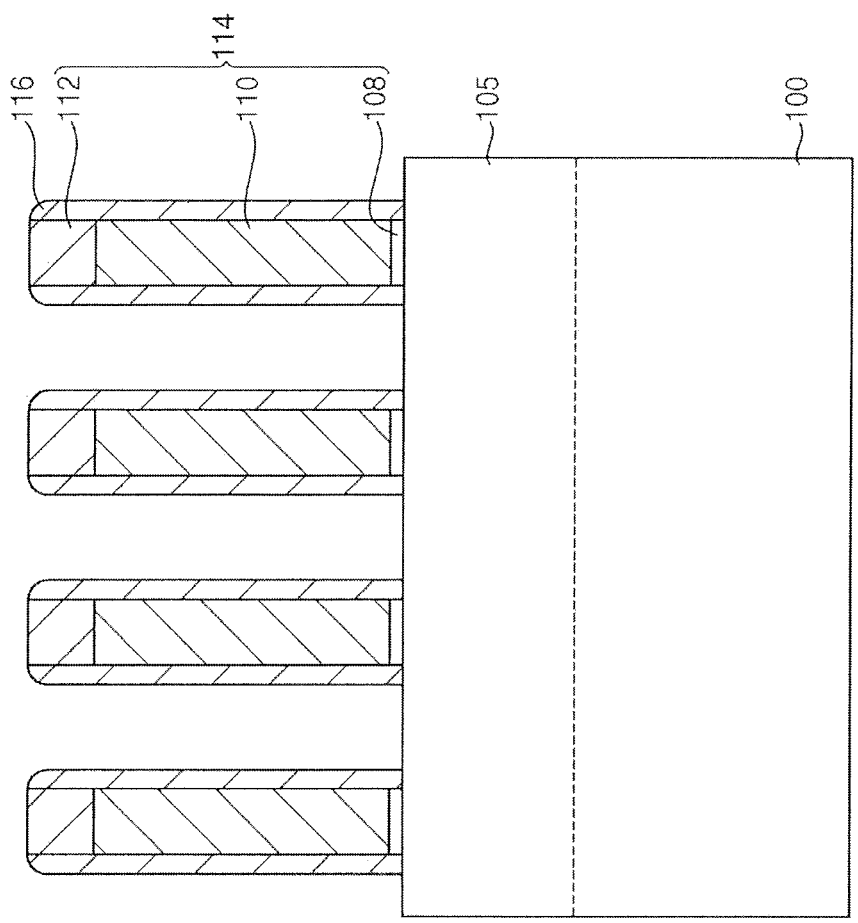
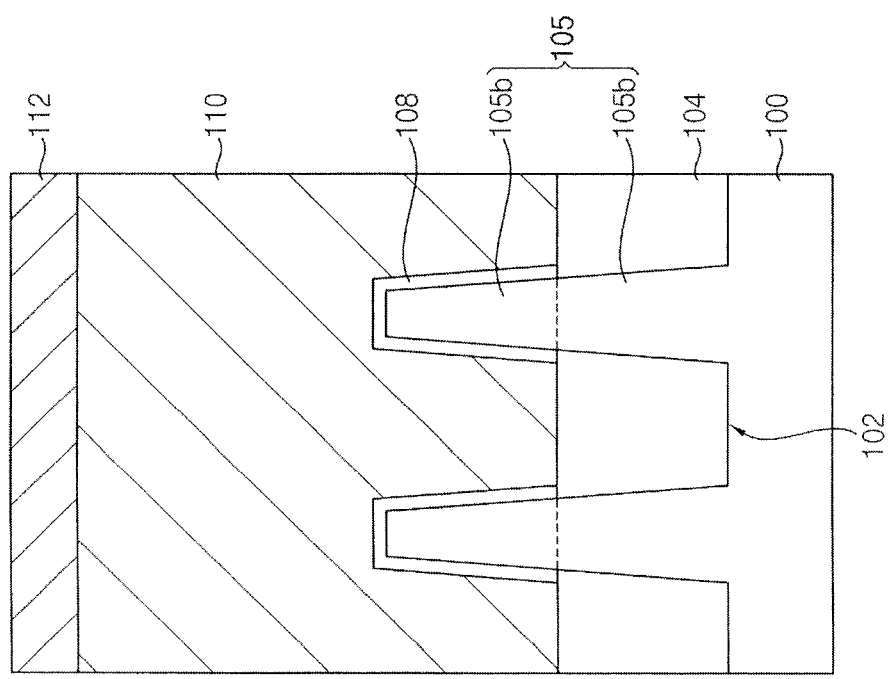

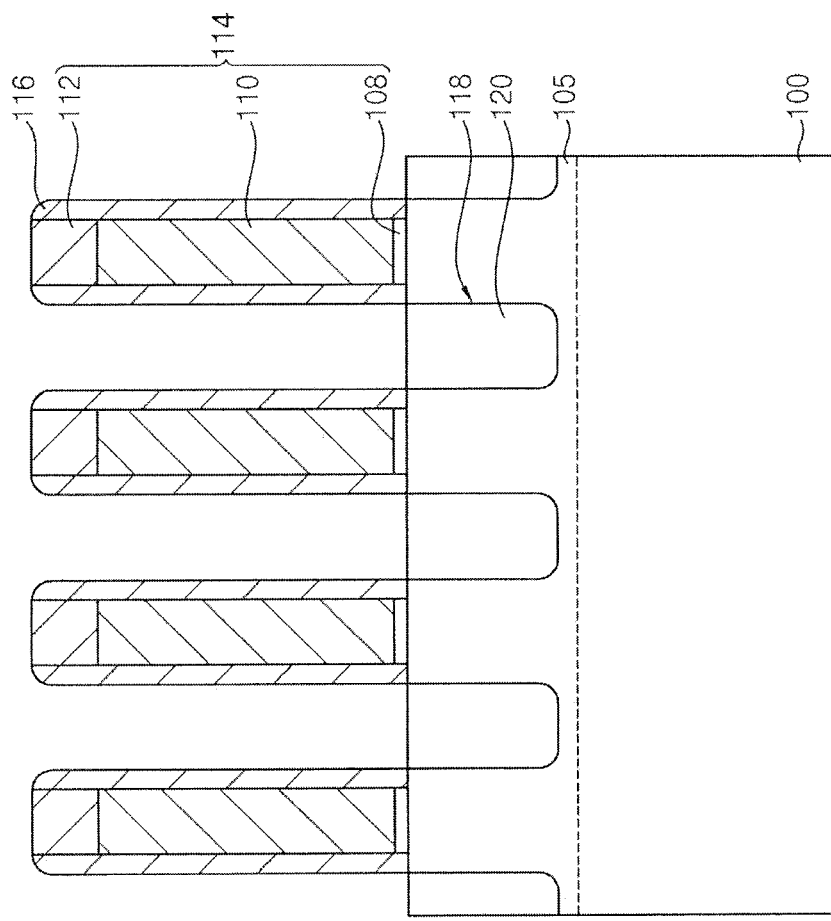
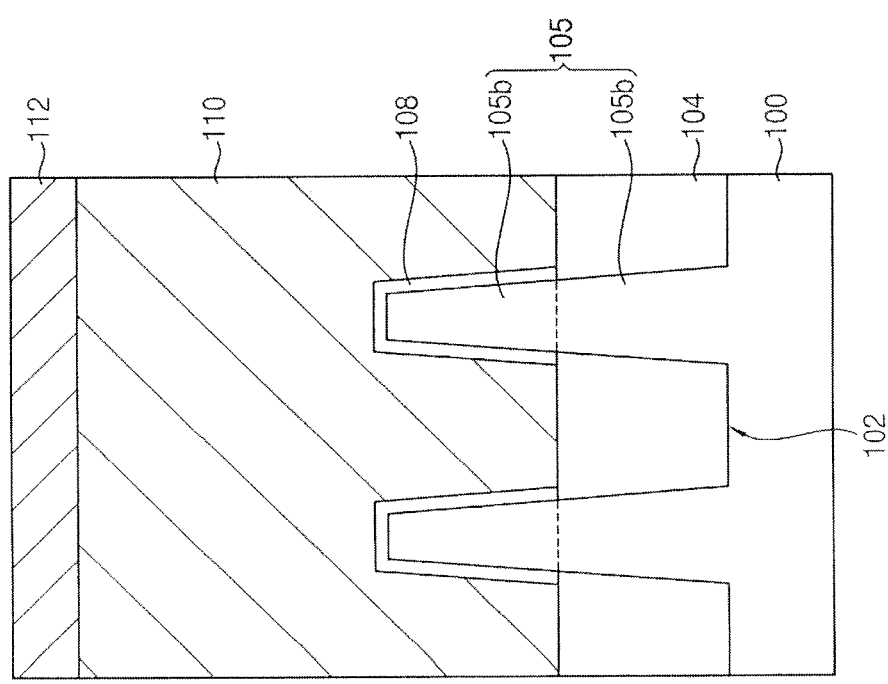
FIG. 2

FIG. 3
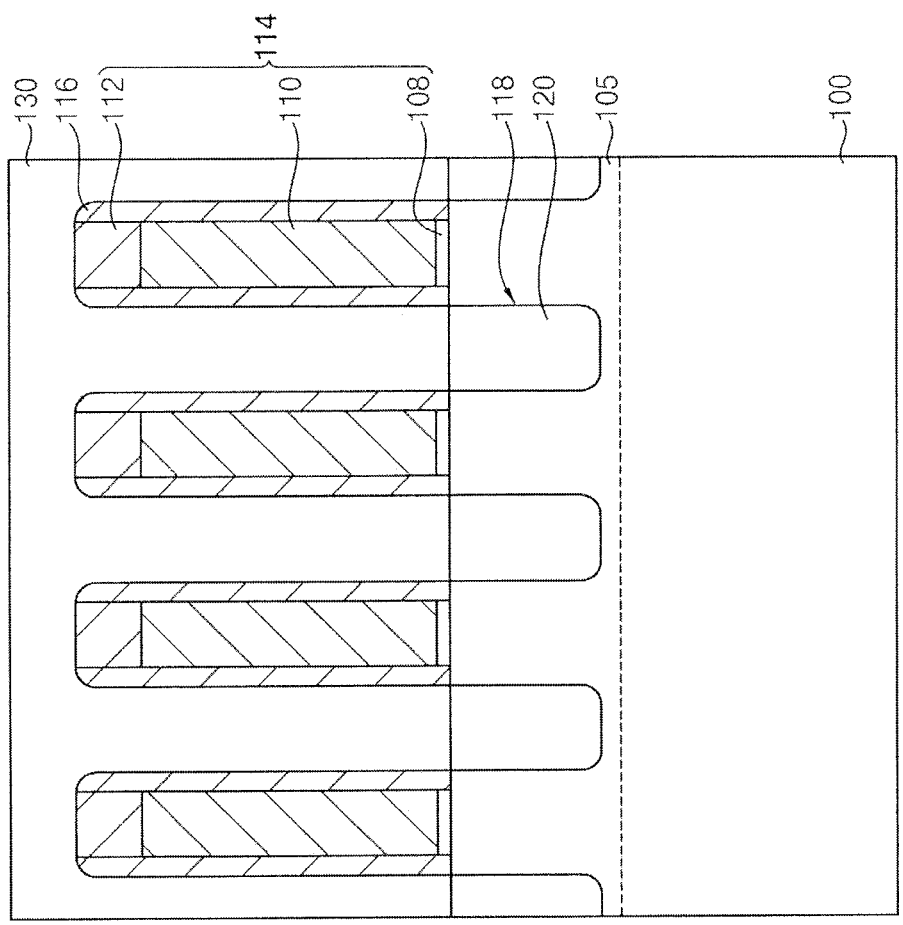
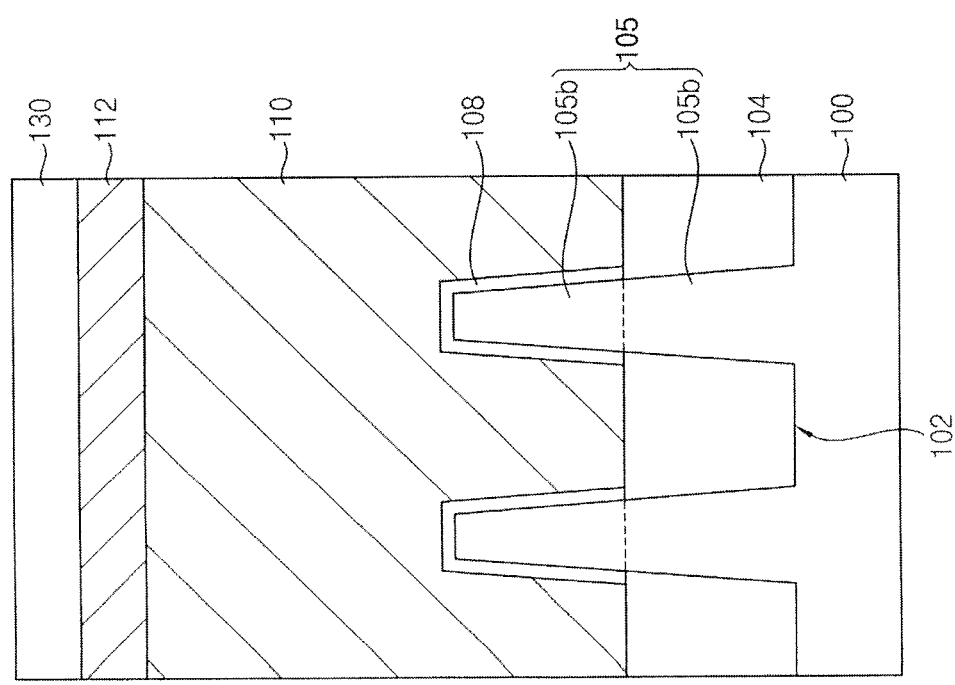

FIG. 5
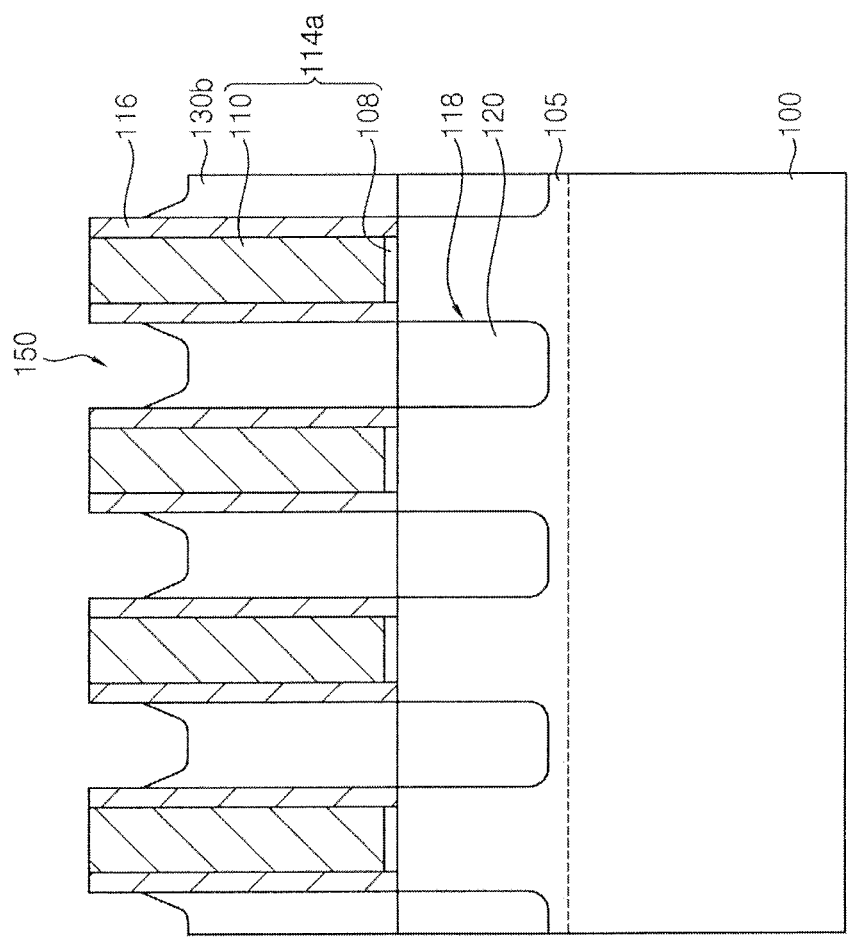
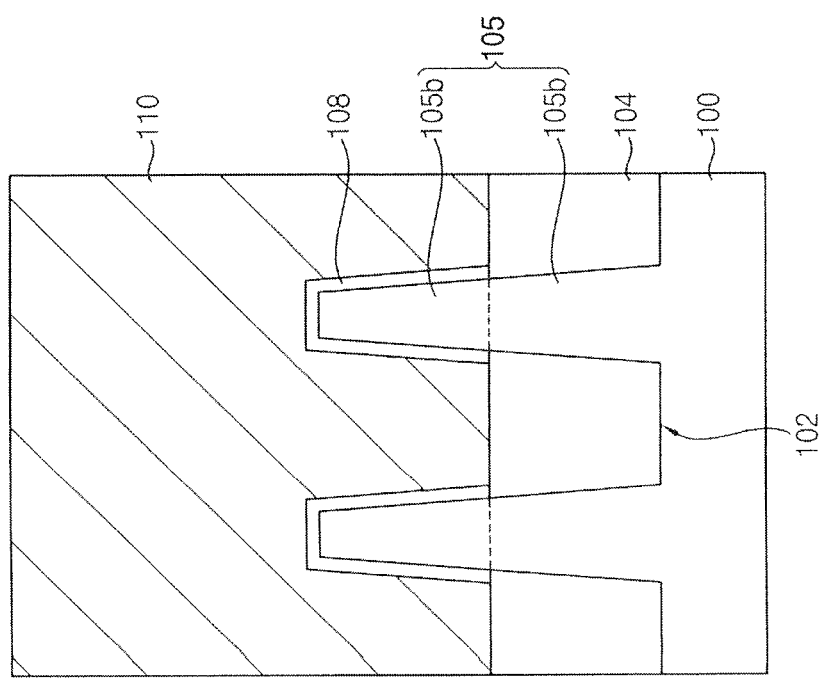

METHODS OF MANUFACTURING A SEMICONDUCTOR DEVICE

CROSS-REFERENCE TO RELATED APPLICATION

Korean Patent Application No. 10-2017-0159654, filed on Nov. 27, 2017, in the Korean Intellectual Property Office, and entitled: "Methods of Manufacturing a Semiconductor Device," is incorporated by reference herein in its entirety.

BACKGROUND

Embodiments relate to methods of manufacturing a semiconductor device.

SUMMARY

The embodiments may be realized by providing a method of manufacturing a semiconductor device, the method including forming dummy gate structures on a substrate; forming spacers on sidewalls of the dummy gate structures; forming a preliminary first interlayer insulation pattern to fill a gap between adjacent spacers; etching an upper portion of the preliminary first interlayer insulation pattern through a first etching process to form a preliminary second interlayer insulation pattern; implanting an ion on the dummy gate structures, the spacers, and the preliminary second interlayer insulation pattern through an ion-implanting process; etching an upper portion of the preliminary second interlayer insulation pattern through a second etching process to form an interlayer insulation pattern having a flat upper surface; and forming a capping pattern on the interlayer insulation pattern to fill the gap between the spacers.

The embodiments may be realized by providing a method of manufacturing a semiconductor device, the method including forming dummy gate structures on a substrate; forming a preliminary first interlayer insulation pattern to fill a gap between the dummy gate structures; etching an upper portion of the preliminary first interlayer insulation pattern to form a preliminary recess having a round-shaped bottom and a preliminary second interlayer insulation pattern under the preliminary recess through a first etching process; implanting an ion on the dummy gate structures and the preliminary second interlayer insulation pattern; etching a portion of the preliminary second interlayer insulation pattern through a second etching process to form a recess having a flat bottom and an interlayer insulation pattern under the recess; forming a capping pattern on the interlayer insulation pattern; and replacing the dummy gate structures with gate structures.

The embodiments may be realized by providing a method of manufacturing a semiconductor device, the method including forming gate structures on a substrate; forming a preliminary interlayer insulation pattern to fill a gap between the gate structures; forming a mask pattern on the gate structures and the preliminary interlayer insulation pattern to cover a contact-forming region; partially etching an upper portion of the preliminary interlayer insulation pattern using the mask pattern as an etching mask to form a recess and an interlayer insulation patter under the recess; forming a capping pattern on the interlayer insulation pattern to fill the recess; implanting an ion on the gate structures, the interlayer insulation pattern, and the capping pattern; and etching the interlayer insulation pattern doped with an ion to form a contact hole.

BRIEF DESCRIPTION OF THE DRAWINGS

Features will be apparent to those of skill in the art by describing in detail exemplary embodiments with reference to the attached drawings in which:

FIGS. 1 to 15 illustrate cross-sectional views of stages in a method of manufacturing a semiconductor device according to an example embodiment.

DETAILED DESCRIPTION

Figure 4:
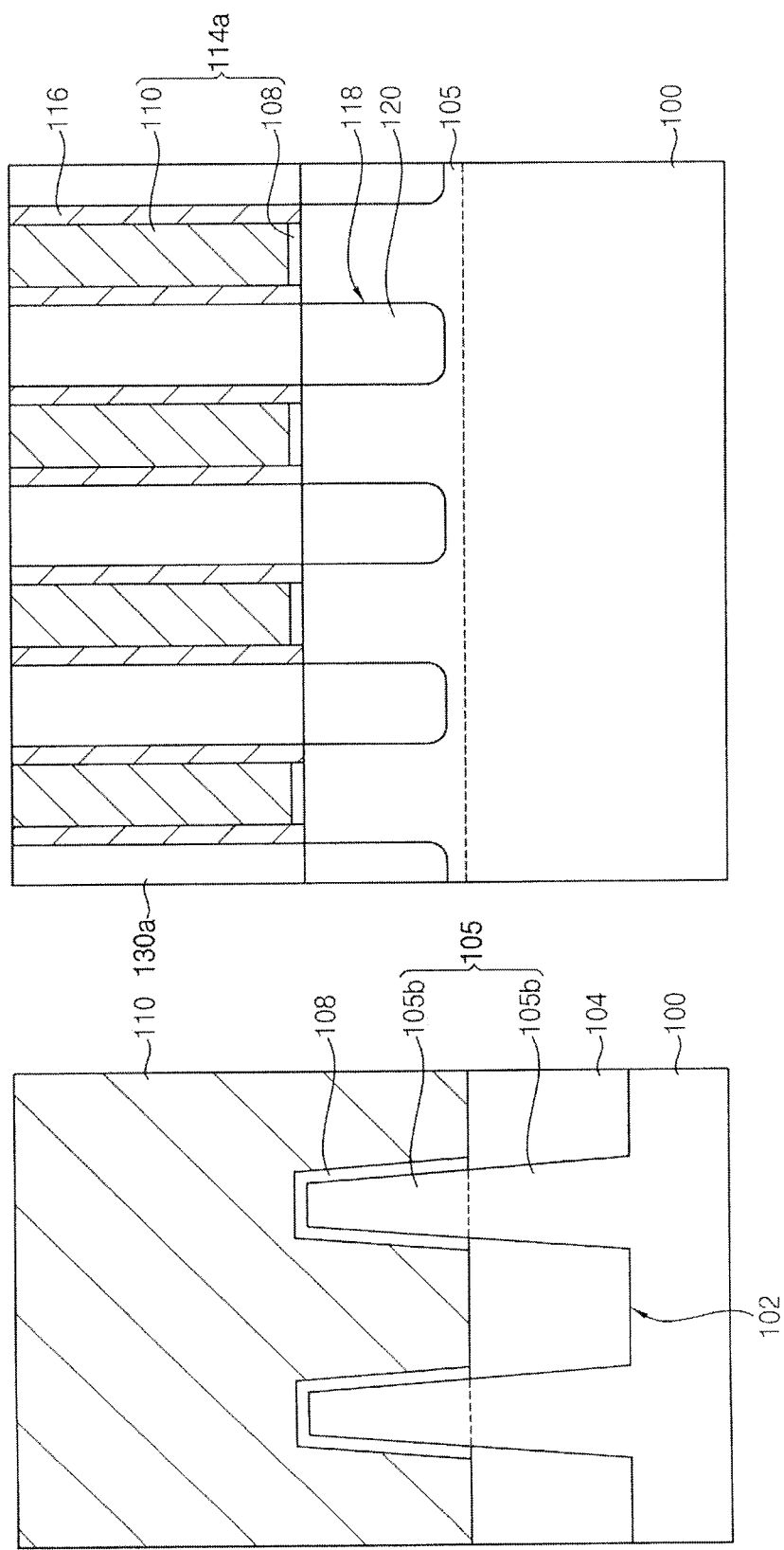

In each of the drawings, a left part illustrates a cross-section of a central portion of a gate structure, which is taken along the second direction, and a right part illustrates a cross-section of an active fin portion of a gate structure, which is taken along the first direction. The first and second directions are parallel with an upper surface of a substrate and are perpendicular to each other.

FIGS. 1 to 15 illustrate cross-sectional views of stages in a method of manufacturing a semiconductor device according to an example embodiment.

Referring to FIG. 1, an upper portion of a substrate 100 may be partially etched to form a trench 102. As the trench 102 is formed on the substrate 100, active fins 105 may be formed at the substrate 100. An isolation pattern 104 may be formed to fill a lower portion of the trench 102. A preliminary dummy gate structure 114 may be formed on the active fins 105 and the isolation pattern 104. A spacer 116 may be formed on a sidewall of the preliminary dummy gate structure 114.

The substrate 100 may include a single-crystalline semiconductor material such as silicon, germanium or silicon-germanium. In an implementation, the substrate 100 may be a silicon-on-insulator (SOI) substrate or a germanium-on-insulator (GOI) substrate.

In an implementation, the active fins 105 may extend along the first direction, and may be arranged along the second direction.

In an implementation, in order to form the isolation pattern 104, an isolation layer may be formed on the substrate 100 to sufficiently fill the trench 102, and may be planarized such that an upper surface of the substrate 100 is exposed. Thereafter, an upper portion of the isolation layer may be removed such that an upper sidewall of the active fin 105 is exposed. For example, the isolation layer may include an oxide such as silicon oxide.

The active fin 105 may include a lower active pattern 105b, of which a sidewall is surrounded by the isolation pattern 104, and an upper active pattern 105a protruding upwardly from the isolation pattern 104. The upper active pattern 105a may be provided for an active region. A region where the isolation pattern 104 is formed may be provided for a field region.

The preliminary dummy gate structure 114 may include a dummy gate insulation pattern 108, a dummy gate pattern 110 and a mask pattern 112. Hereinafter, a method for forming the preliminary dummy gate structure 114 will be described more fully.

A dummy gate insulation layer may be formed on a surface of the upper active pattern 105a. A dummy gate layer may be formed on the dummy gate insulation layer to fully fill a gap between the upper active patterns 105a. An upper surface of the dummy gate layer may be higher than an upper surface of the upper active pattern 105a.

In an implementation, the dummy gate insulation layer may include silicon oxide. In an implementation, the dummy gate insulation layer may be formed through a thermal oxidation process. When the dummy gate insulation layer is formed through a thermal oxidation process, the dummy gate insulation layer may be formed only on an exposed surface of the upper active pattern 105a. In an implementation, the dummy gate insulation layer may be formed through a chemical vaporization deposition process or an atomic layer deposition process. When the dummy gate insulation layer is formed through a chemical vaporization deposition process or an atomic layer deposition process, the dummy gate insulation layer may be conformally formed on the upper active pattern 105a and the isolation pattern 104.

In an implementation, the dummy gate layer may include polysilicon. In an implementation, the dummy gate layer may be formed through a chemical vaporization deposition process or an atomic layer deposition process.

The mask pattern 112 is formed on the dummy gate layer. The dummy gate layer and the dummy gate insulation layer may be patterned using the mask pattern 112 as an etching mask to form the preliminary dummy gate structure 114. For example, the mask pattern 112 may include silicon nitride or silicon oxynitride.

In an implementation, the preliminary dummy gate structure 114 may extend along the second direction, and a plurality of the preliminary dummy gate structures 114 may be arranged along the first direction.

A spacer layer may be formed on surfaces of the preliminary dummy gate structure 114, the isolation pattern 104, and the upper active pattern 105a. The spacer layer may be anisotropic-etched to form the spacer 116 on the sidewall of the preliminary dummy gate structure 114. The spacer layer may include silicon nitride or silicon oxynitride. In an implementation, the spacer layer may be formed through a chemical vaporization deposition process or an atomic layer deposition process.

Referring to FIG. 2, an upper portion of the active fin 105 between the spacers 116 may be etched to form a first recess 118. An epitaxial pattern 120 may be formed in the first recess 118 to provide a source/drain region.

For example, the upper portion of the active fin 105 may be removed through a dry-etching process using the preliminary dummy gate structure 114 and the spacer 116, which is formed on the sidewall of the preliminary dummy gate structure 114, as an etching mask to form the first recess 118.

In an implementation, the etching process for forming the first recess 118 may be performed in situ with the etching process for forming the spacer 116.

The epitaxial pattern 120 may be formed by performing a selective epitaxial growth (SEG) process using a surface of the active fin 105, which corresponds a bottom of the first recess 118, as a seed. In an implementation, a plurality of epitaxial patterns 120, which are parallel to each other along the second direction, may contact each other at sidewalls thereof. In an implementation, after the epitaxial pattern 120 is formed, an impurity-implanting process and a heat-treating process may be further performed to form a source-drain region.

Referring to FIG. 3, a preliminary first interlayer insulation layer 130 may be formed on the preliminary dummy gate structure 114, the spacer 116, the epitaxial pattern 120 and the isolation pattern 104. The preliminary first interlayer insulation layer 130 may be formed to fully fill a gap between the preliminary dummy gate structures 114 and to cover the preliminary dummy gate structures 114.

The preliminary first interlayer insulation layer 130 may include silicon oxide. The preliminary first interlayer insulation layer 130 may be formed through a chemical vaporization deposition process, a spin-on-glass (SOG) process, or an atomic layer deposition process.

Referring to FIG. 4, the preliminary first interlayer insulation layer 130 may be planarized such that an upper surface of the dummy gate pattern 110 (included in the preliminary dummy gate structures 114) is exposed. Thus, dummy gate structures 114a, in which the dummy gate insulation pattern 108 and the dummy gate pattern 110 are deposited, may be formed, and a preliminary first interlayer insulation pattern 130a may be formed between the dummy gate structures 114a.

The planarizing process may include a chemical mechanical polishing (CMP) process and/or an etch-back process. The planarizing process may remove the mask pattern 112.

Referring to FIG. 5, an upper portion of the preliminary first interlayer insulation pattern 130a may be etched through a first etching process to form a preliminary second recess 150 having a bottom with a round or rounded shape. As a result, a preliminary second interlayer insulation pattern 130b having an upper surface relatively protruding nearby the spacer 116 may be formed. For example, portions of the preliminary second interlayer insulation pattern 130b adjacent to the spacer 116 may protrude in a direction away from the substrate 100 such that portions of the preliminary second interlayer insulation pattern 130b not adjacent to the spacer 116 are closer to the substrate 100 than the portions of the preliminary second interlayer insulation pattern 130b adjacent to the spacer 116.

In an implementation, the preliminary second recess 150 may have a depth larger than ½ of a depth of a target second recess to be formed. For example, the preliminary second recess 150 may have a depth of ⅔ to 9/10 of the target depth of the second recess.

In the first etching process, while the spacer 116 including silicon nitride may be barely etched, the preliminary first interlayer insulation pattern 130a including silicon oxide may be substantially etched. The first etching process may be performed such that an etching selectivity between silicon oxide and silicon nitride is relatively high.

When the upper portion of the preliminary first interlayer insulation pattern 130a is etched through the first etching process, a portion of the preliminary first interlayer insulation pattern 130a, which is adjacent to the spacer 116, may be less etched compared to other portion. Thus, a bottom of the preliminary second recess 150 may not be flat, and the preliminary second recess 150 may have a shape deeper in a central portion along the first direction. Thus, the upper surface of the preliminary second interlayer insulation pattern 130b may be higher nearby or adjacent to the spacer 116 than in the central portion along the first direction.

In an implementation, the preliminary second recess 150 may be formed through an etching process not using plasma. An etching gas for forming the preliminary second recess 150 may include, e.g., HF and $NH_3$.

The first etching process may include an etching reaction process and a purging process or a post-treatment process for removing reaction byproducts after the etching reaction process.

In an implementation, the etching reaction process and the purging process may be performed in a same chamber. For example, a cycle consisting of the etching reaction process and the purging process may be repeatedly performed to etch the upper portion of the preliminary first interlayer insulation pattern 130a. The etching reaction process and the purging process may be performed at a relatively high temperature under a relatively high pressure.

In the first etching process, a chamber pressure, an inflow ratio of the etching gas, the number of the cycles, and a process time may be properly adjusted. In an implementation, the chamber pressure may be 1.8 to 3 Torr, a gas ratio of HF and $NH_3$ may be 2:1 to 20:1, the number of the cycles may be 1 to 10, and/or the process time may be 1 to 10 seconds.

In an implementation, the etching reaction process and the purging process may be performed in different chambers. For example, the etching reaction process may be performed at ambient temperature or a temperature of 10° C. to 30° C. at a relatively lower pressure, and the purging process may be performed at a temperature higher than in the etching reaction process.

Figure 6:
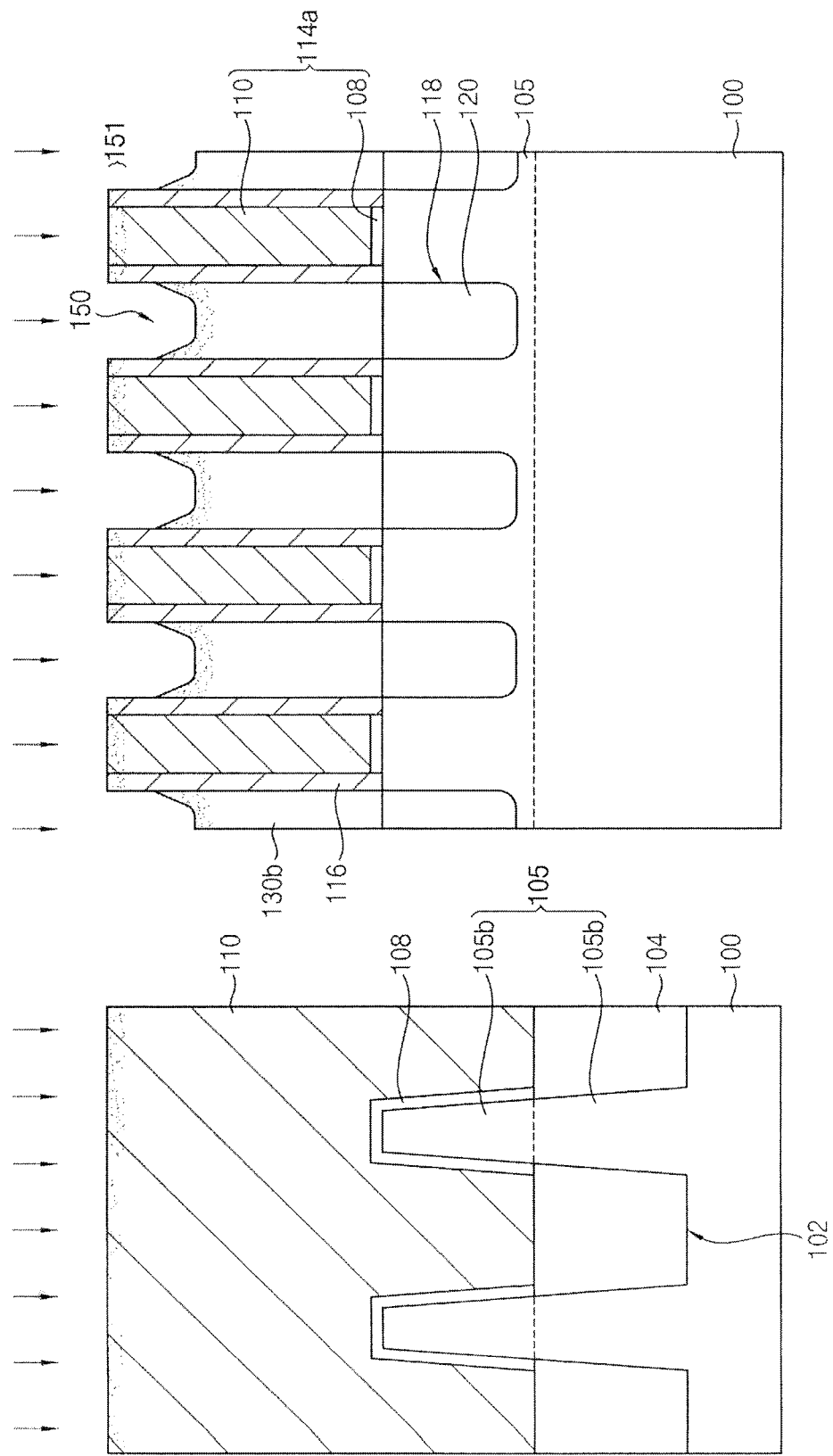

Referring to FIG. 6, an ion may be implanted on the dummy gate pattern 110, the spacer 116, and the preliminary second recess 150. Thus, an ion-implanted region 151 may be formed under the upper surfaces of the dummy gate pattern 110, the spacer 116, and the preliminary second interlayer insulation pattern 130b.

In an implementation, the ion may be implanted along a vertical direction to a surface of the substrate 100 or along a direction tilted to the surface of the substrate 100 by a predetermined inclination. When the ion is implanted along the vertical direction, the ion may be implanted into an upper portion of the preliminary second interlayer insulation pattern 130b while being barely implanted on a sidewall of the spacer 116.

The ion-implanting process may be performed to change etching characteristics of the spacer 116 and/or the preliminary second interlayer insulation pattern 130b. For example, the spacer 116 doped with the ion may have different etching characteristics from the spacer 116 that is not doped with the ion. The preliminary second interlayer insulation pattern 130b doped with the ion may have different etching characteristics from the preliminary second interlayer insulation pattern 130b that is not doped with the ion.

In an implementation, the ion used for the ion-implanting process may include ions of, e.g., boron, silicon, arsenic, phosphor, argon, nitrogen, carbon, oxygen, $BF_2$, fluorine, hydrogen, helium, germanium, gallium, krypton, xenon, or the like.

In an implementation, a plurality of dopants different from each other may be used in the ion-implanting process. The dopants may be implanted sequentially or together (e.g., concurrently).

For example, when a boron ion is implanted, an etching ratio of silicon oxide may be reduced while an etching ratio of silicon nitride may be barely changed. For example, etching of silicon oxide may be slowed down, and an etching selectivity between silicon oxide and silicon nitride may be reduced. Thus, an etching thickness of the preliminary second interlayer insulation pattern 130b may be finely adjusted, and protrusion of the preliminary second interlayer insulation pattern 130b may be removed more quickly. In an implementation, when a silicon ion is implanted, an etching ratio of silicon nitride may be increased while an etching ratio of silicon oxide may be barely changed. Thus, an etching ratio of the preliminary second interlayer insulation pattern 130b may be increased nearby the spacer 116 including silicon nitride.

In an implementation, the ion-implanting process may be performed at a temperature of, e.g., −100° C. to 600° C. In an implementation, an annealing process may be further performed after the ion-implanting process.

Figure 7:
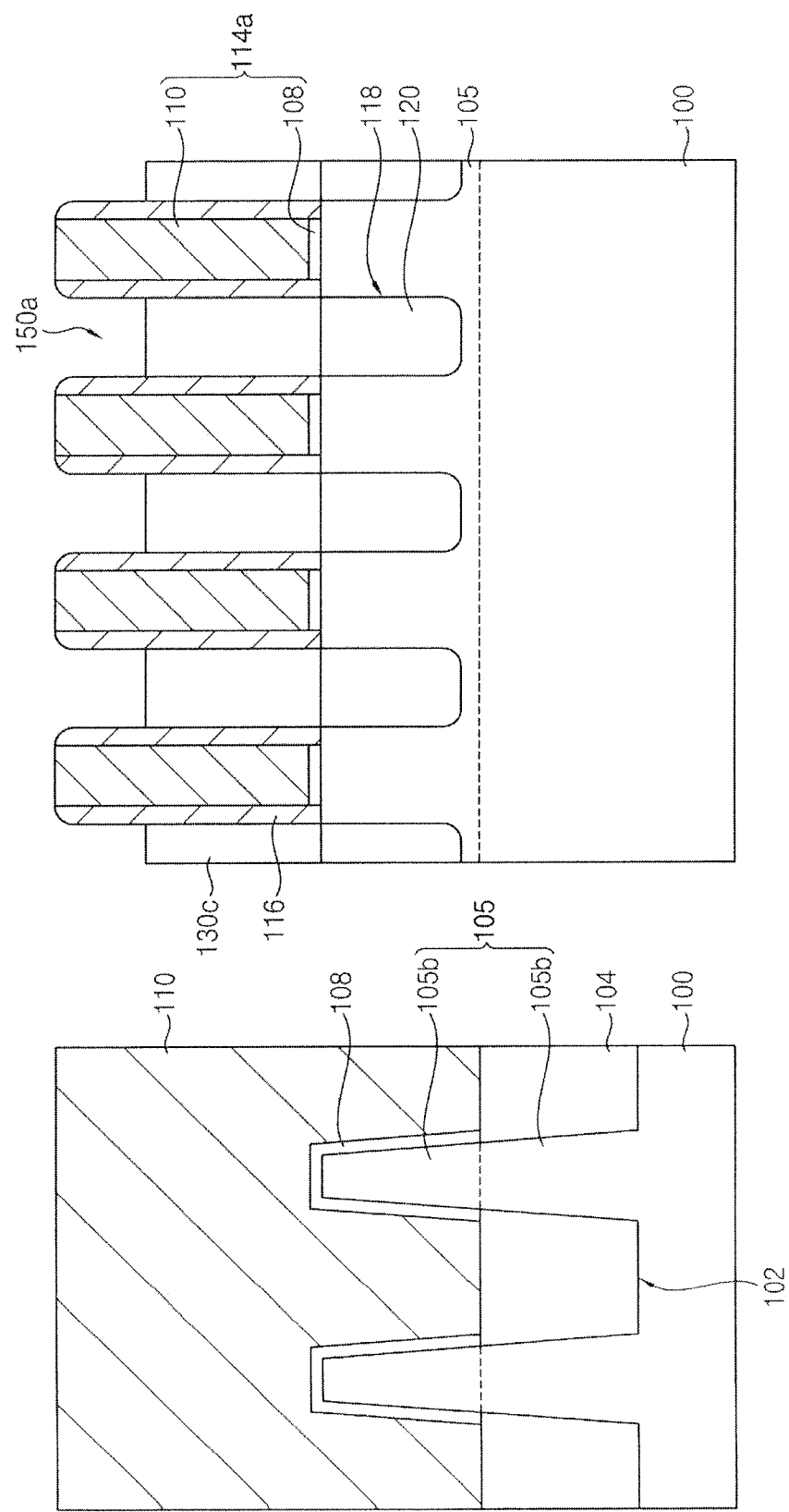

Referring to FIG. 7, the bottom of the preliminary second recess 150 may be partially etched through a second etching process to form a second recess 150a having a substantially flat bottom. Thus, a first interlayer insulation pattern 130c having a flat upper surface may be formed.

In an implementation, the second etching process may etch the preliminary second interlayer insulation pattern 130b in a region adjacent to the spacer 116 more quickly than in a region that is not adjacent to the spacer 116.

An etching selectivity between silicon oxide and silicon nitride in the second etching process may be smaller than an etching selectivity between silicon oxide and silicon nitride in the first etching process.

In an implementation, an etching ratio of the spacer 116 may be increased, or an etching ratio of the preliminary second interlayer insulation pattern 130b may be reduced in the second etching process than in the first etching process.

When an etching ratio of the spacer 116 is increased, an etching ratio of the preliminary second interlayer insulation pattern 130b in the region adjacent to the spacer 116 may become higher than in the other region. Thus, the bottom of the second recess 150a may become flat. When an etching ratio of the preliminary second interlayer insulation pattern 130b is reduced, the protrusion of the preliminary second interlayer insulation pattern 130b may be etched more quickly than other portion. Thus, the bottom of the second recess 150a may become flat.

In an implementation, the second recess 150a may be formed through an etching process not using plasma. An etching gas for forming the second recess 150a may include HF and $NH_3$.

In an implementation, the chamber pressure may be 1.8 to 3 Torr, a gas ratio of HF and $NH_3$ may be 2:1 to 20:1, the number of the cycles may be 1 to 10, and/or the process time may be 1 to 10 seconds.

In an implementation, the second etching process may be performed under the same conditions as the first etching process.

In an implementation, the second etching process may be performed under different conditions from the first etching process. For example, when a silicon ion or a carbon ion is implanted in the previous process, the gas ratio of HF and $NH_3$ may be lowered and the chamber pressure may be increased to reduce an etching ratio of silicon oxide.

When the second etching process is performed, an upper portion of the spacer 116 may be partially etched so that a height of the spacer 116 may be reduced.

Figure 8:
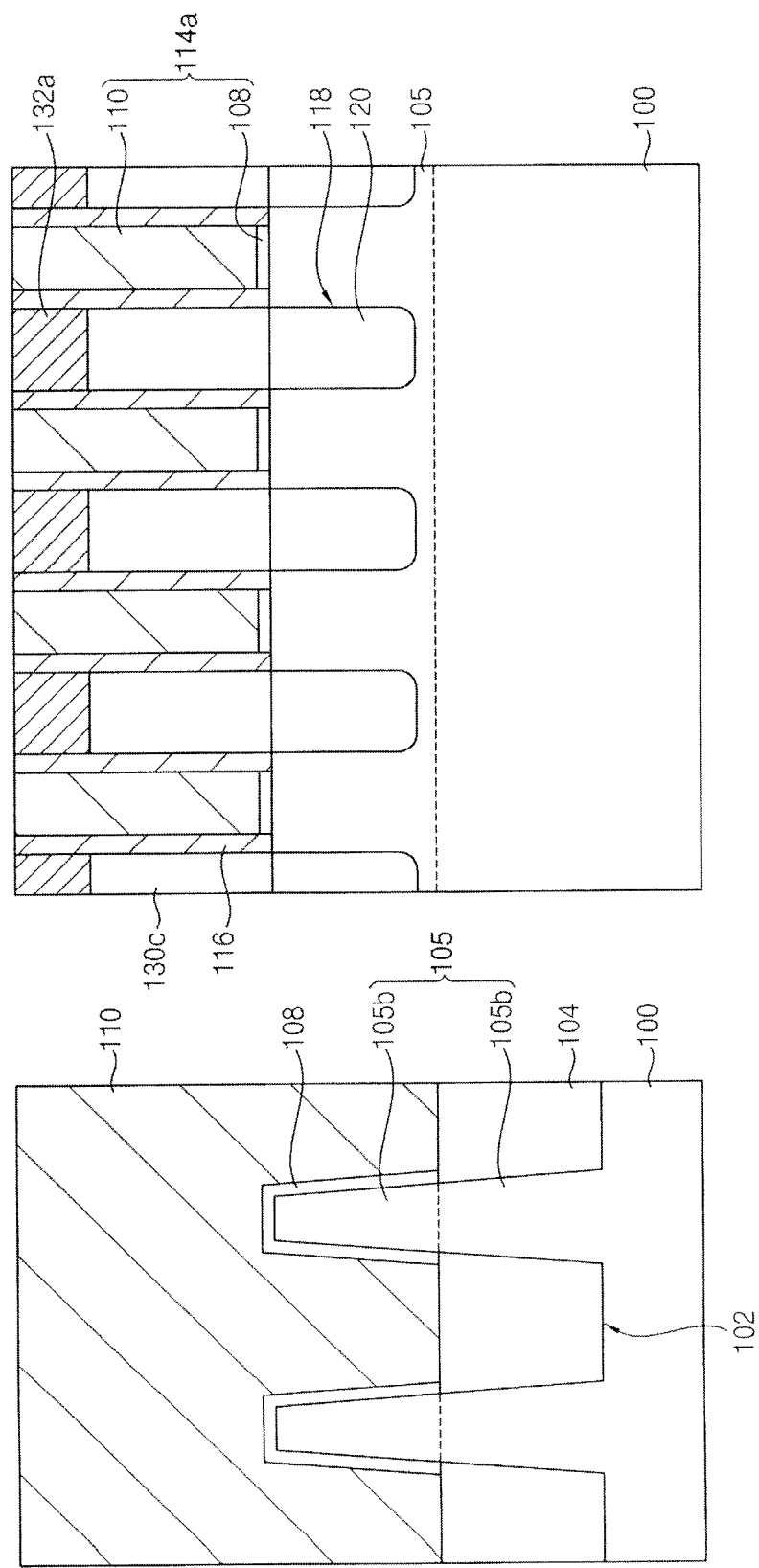

Referring to FIG. 8, a capping layer may be formed on the dummy gate pattern 110, the spacer 116, and the first interlayer insulation pattern 130c to fully fill the second recess 150a. Thereafter, the capping layer may be planarized such that upper surfaces of the dummy gate pattern 110 and the spacer 115 are exposed so that a preliminary first capping pattern 132a is formed in the second recess 150a.

The capping layer may include silicon nitride. The capping layer may be formed through a chemical vaporization deposition process or an atomic layer deposition process.

Because a bottom of the second recess 150a is flat, a bottom surface of the preliminary first capping pattern 132a may be flat. Thus, the first interlayer insulation pattern 130c may be barely interposed between the preliminary first capping pattern 132a and the spacer 116. In an implementation, a lateral thickness of the first interlayer insulation pattern 130c interposed between the preliminary first capping pattern 132a and the spacer 116 may be equal to or less than 3 nm.

If the second recess were to have a round-shaped bottom (unlike the above-described example embodiment), the first interlayer insulation pattern may be interposed between the preliminary first capping pattern and the spacer. Thus, the preliminary first capping pattern may have a very thin vertical thickness nearby or adjacent to a sidewall of the spacer. Thus, the preliminary first capping pattern may be entirely removed in the region adjacent to the sidewall of the spacer through following processes. Thus, the first interlayer insulation pattern under the preliminary first capping pattern may be exposed and may be excessively etched.

However, in the example embodiment, the preliminary first capping pattern 132a may have a flat bottom surface. Thus, the preliminary first capping pattern 132a may not have a thinner portion having a less vertical thickness, and may have uniform vertical thickness in an entire portion. Thus, in the following processes, the first interlayer insulation pattern 130c may be sufficiently protected by the preliminary first capping pattern 132a.

Figure 9:
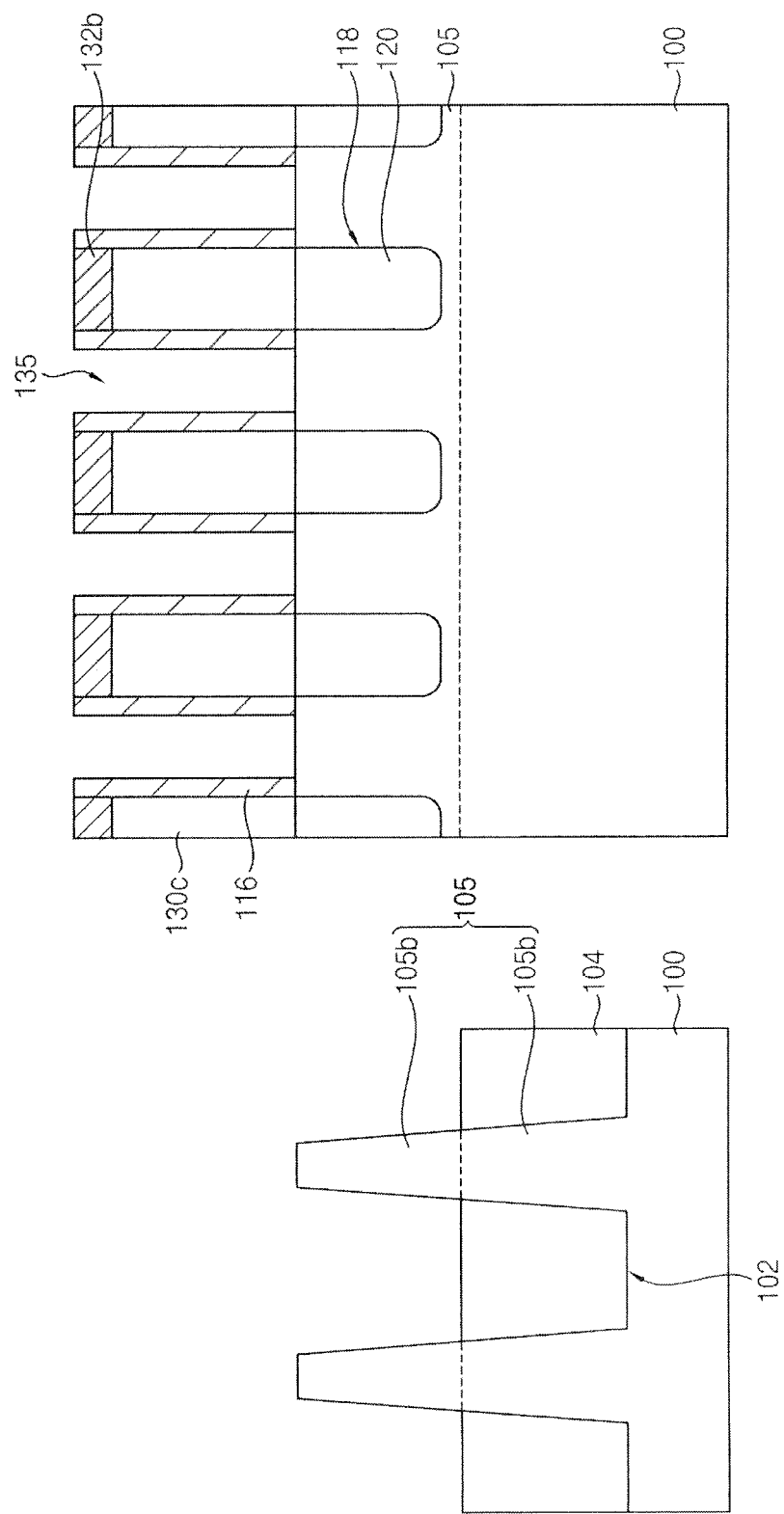

Referring to FIG. 9, the dummy gate pattern 110 may be removed, and the dummy gate insulation pattern 108 under the dummy gate pattern 110 may be removed. Thus, an opening 135 may be formed to expose a surface of the active fin 105. A structure including the opening 135 may be provided for a mold for forming a gate structure. The removing process may include an isotropic etching process.

In the process of forming the opening 135, the spacer 116 and the preliminary first capping pattern 132a may be partially etched. As a result, a preliminary second capping pattern 132b having a less or reduced height relative to the preliminary first capping pattern 132a may be formed.

The preliminary second capping pattern 132b may entirely cover an upper surface of the first interlayer insulation pattern 130c so that any portion of the first interlayer insulation pattern 130c may not be exposed. Thus, in the process of removing the dummy gate insulation pattern 108, the preliminary second capping pattern 132b may protect the first interlayer insulation pattern 130c so that the first interlayer insulation pattern 130c may not be removed or damaged.

If the preliminary first capping pattern were to not have a flat bottom surface (unlike the example embodiment), the preliminary second capping pattern could be partially removed in the process of forming the opening to expose a portion of the first interlayer insulation pattern. The dummy gate insulation layer and the first interlayer insulation pattern may be formed of silicon oxide, and the exposed first interlayer insulation pattern may be excessively etched when the dummy gate insulation layer is removed. Thus, a deep dent could be formed at an upper surface of the first interlayer insulation pattern.

Figure 10:
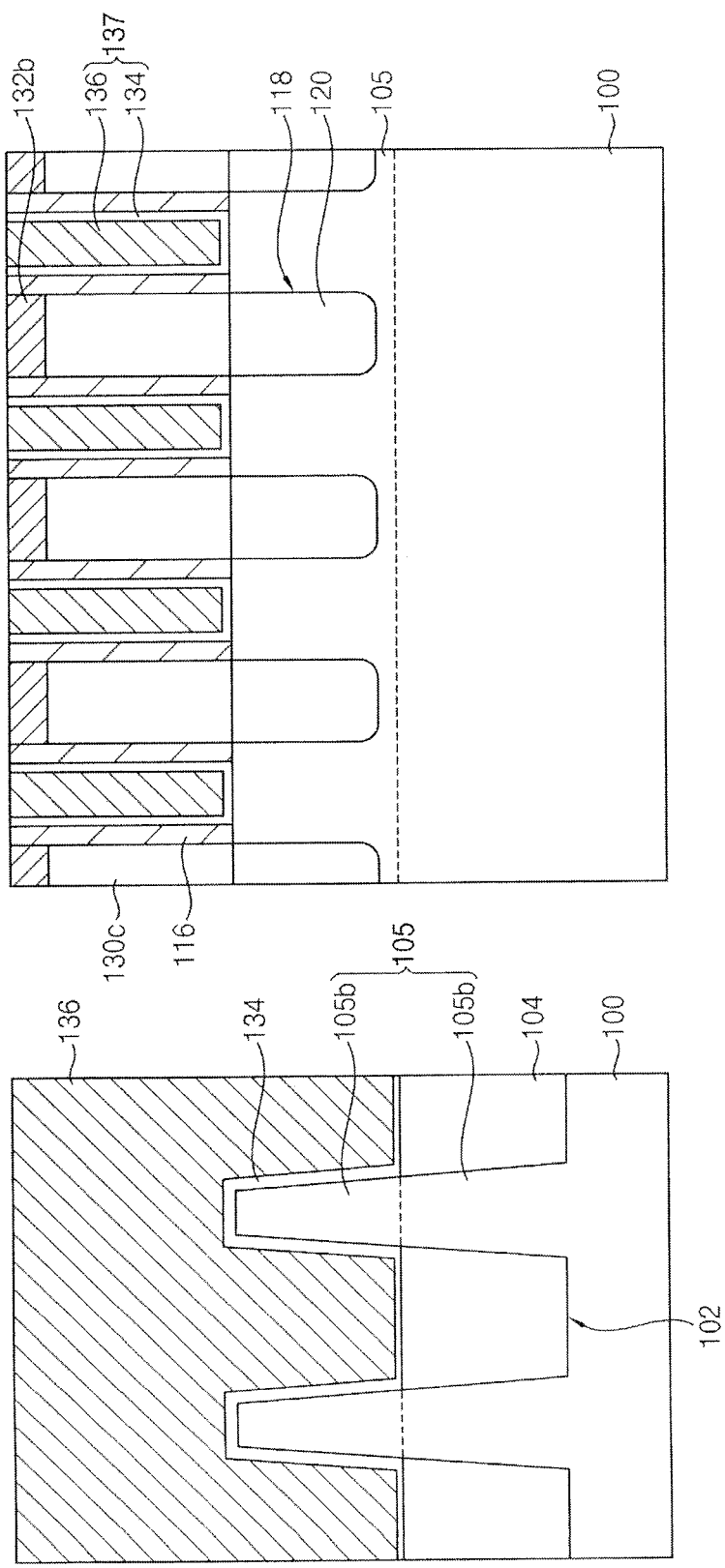

Referring to FIG. 10, a preliminary gate structure 137 may be formed in the opening 135.

For example, a thermal oxidation process may be performed on an upper surface of the active fin 105, which is exposed by the opening 135, to form an interface layer. A gate insulation layer may be formed to be conformal on the interface layer, the isolation pattern 104, the spacer 116, and the preliminary second capping pattern 132b. A gate electrode layer may be formed on the gate insulation layer to fully fill the opening 135. Thereafter, the gate electrode layer may be planarized such that an upper surface of the preliminary second capping pattern 132b is exposed. As a result, the preliminary gate structure 137, in which a preliminary gate insulation pattern 134 and a preliminary gate electrode 136 are deposited, may be formed.

The gate insulation layer may include a metal oxide having a permittivity higher than silicon nitride. In an implementation, the gate insulation layer may include, e.g., hafnium oxide ($HfO_2$), tantalum oxide ($Ta_2O_5$), zirconium oxide ($ZrO_2$) or the like. The gate insulation layer may be formed through a chemical vaporization deposition process or an atomic layer deposition process.

For example, the gate electrode layer may include a metal such as tungsten, aluminum, copper, tantalum or titanium, or a nitride thereof. The gate electrode layer may be formed through a chemical vaporization deposition process, an atomic layer deposition process or a physical vaporization deposition process.

Figure 11:
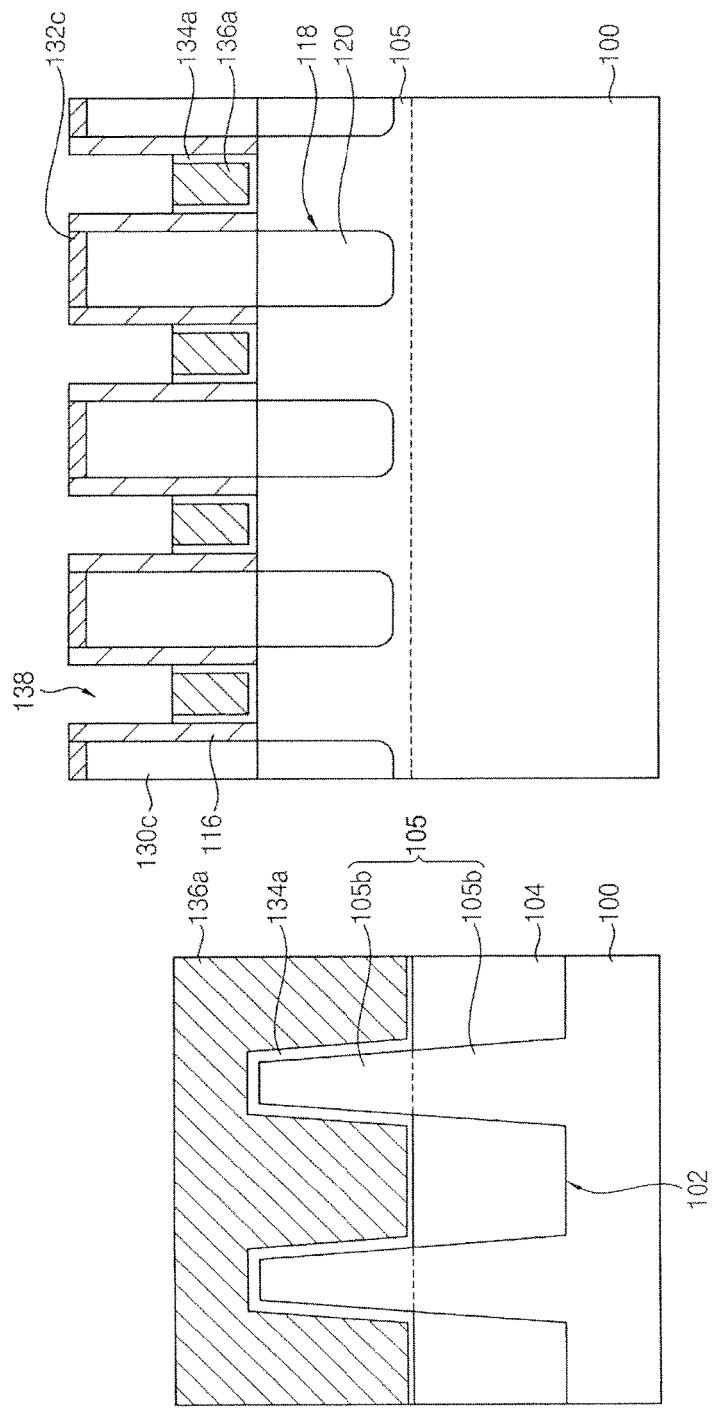

Referring to FIG. 11, the preliminary gate insulation pattern 134 and the preliminary gate electrode 136, which are disposed in an upper portion of the opening 135, may be partially etched to form a third recess 138. Thus, a gate insulation pattern 134a and a gate electrode 136a may be formed in a lower portion of the opening 135.

In the etching process, the spacer 116 and the preliminary second capping pattern 132b may be partially etched. Thus, a first capping pattern 132c having a height smaller than the preliminary second capping pattern 132b may be formed.

The first capping pattern 132c may entirely cover the first interlayer insulation pattern 130c so that any portion of the first interlayer insulation pattern 130c may not be exposed. Furthermore, a dent may not be formed at an upper surface of the first interlayer insulation pattern 130c. Thus, the first capping pattern 132c may protect the first interlayer insulation pattern 130c when the gate insulation pattern 134a and the gate electrode 136a are formed.

Figure 12:
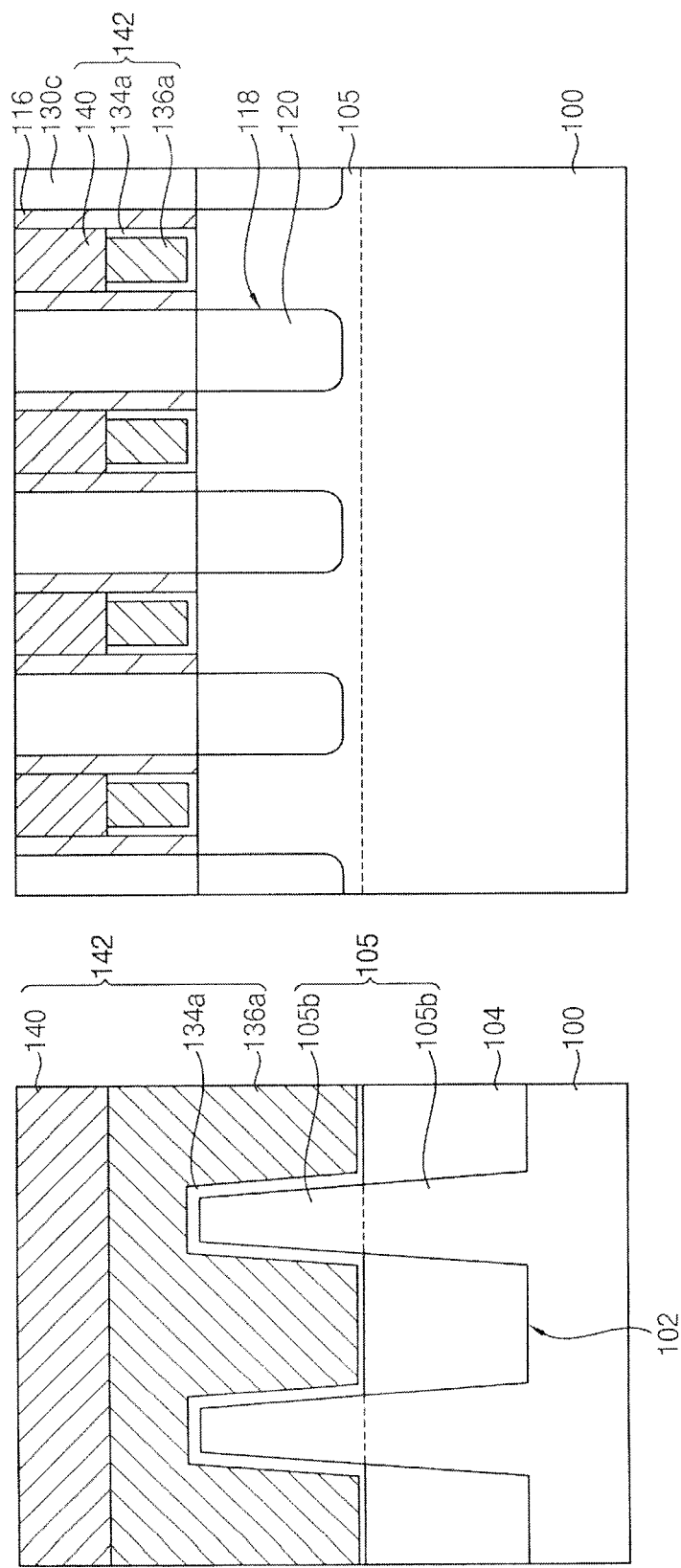

Referring to FIG. 12, a hard mask layer may be formed on the gate insulation pattern 134a, the gate electrode 136a, and the first capping pattern 132c to fill the third recess 138. Thereafter, the hard mask layer may be planarized, such that an upper surface of the first interlayer insulation pattern 130c is exposed, to form a first hard mask 140. The first capping pattern 132c may be entirely removed through the planarizing process.

As a result, a gate structure 142, in which the gate insulation pattern 134a, the gate electrode 136a and the first hard mask 140 are deposited in the opening 135, may be formed.

In an implementation, the hard mask layer may include silicon nitride. The hard mask layer may be formed through a chemical vaporization deposition process or an atomic layer deposition process.

If a dent were to be formed at an upper surface of the first interlayer insulation pattern (unlike the example embodiment), a hard mask layer could partially remain in the dent after the polishing process.

However, in the example embodiment, a dent may not be formed at an upper surface of the first interlayer insulation pattern 130c, and the hard mask layer may not remain on the first interlayer insulation pattern 130c after the polishing process.

Figure 13:
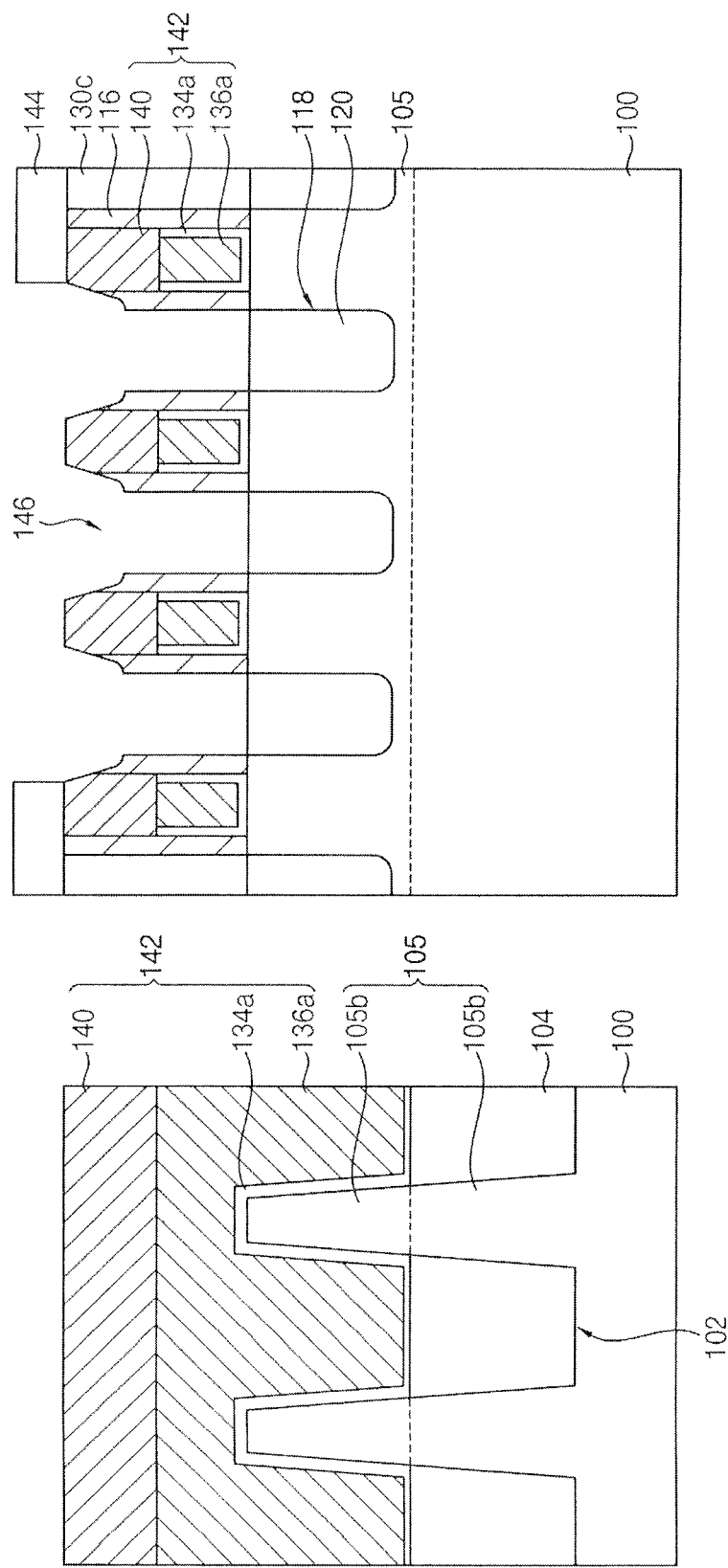

Referring to FIG. 13, an etching mask pattern 144 may be formed on the first interlayer insulation pattern 130c and the first hard mask 140. The first interlayer insulation pattern 130c may be etched using the etching mask pattern 144 such that an upper portion of the epitaxial pattern 120 is exposed. As a result, contact holes 146 may be formed between the gate structures 142.

The etching mask pattern 144 may include an opening that exposes a portion of the first interlayer insulation pattern 130c for forming the contact holes. The gate structures 142 may be also exposed through the opening.

In the etching process, the first interlayer insulation pattern 130c between the spacers 116 may be selectively etched. However, when the etching process is performed, the first hard mask 140 and the spacer, which are formed of silicon nitride, may be partially etched. Thus, an upper width of the contact hole 146 may be larger than a lower width thereof. The portion of the contact hole 146 having a relatively larger width may be disposed to be higher than an upper surface of the gate electrode 136a.

When the etching process is performed, if the hard mask layer were to remain on the first interlayer insulation pattern 130c, the first interlayer insulation pattern 130c could remain un-etched under the hard mask layer. Thus, the contact hole may not expose the epitaxial pattern. Therefore, the contact hole may not be open thereby causing contact-not-open defects.

However, in the example embodiment, the hard mask layer may not remain on the first interlayer insulation pattern 130c. Thus, the contact-not-open defects may be reduced.

Thereafter, the etching mask pattern 144 may be removed.

Figure 14:
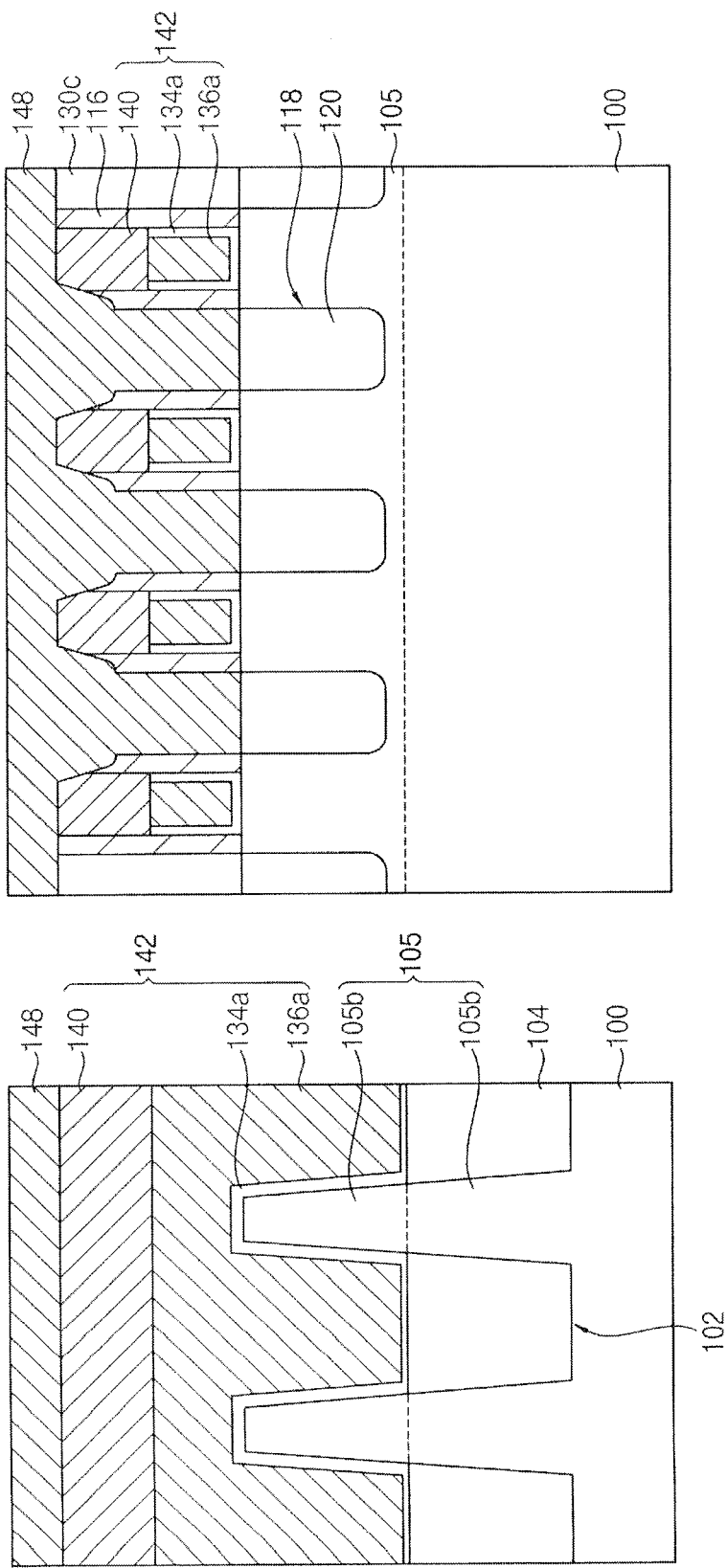

Referring to FIG. 14, a conductive layer 148 may be formed on the first hard mask 140, the spacer 116 and the first interlayer insulation pattern 130c to entirely fill the contact hole 146.

In an implementation, the conductive layer 148 may include a metal such as tungsten, copper, aluminum or the like. The conductive layer 148 may be formed through a chemical vaporization deposition process, an atomic layer deposition process or a physical vaporization deposition process.

Figure 15:
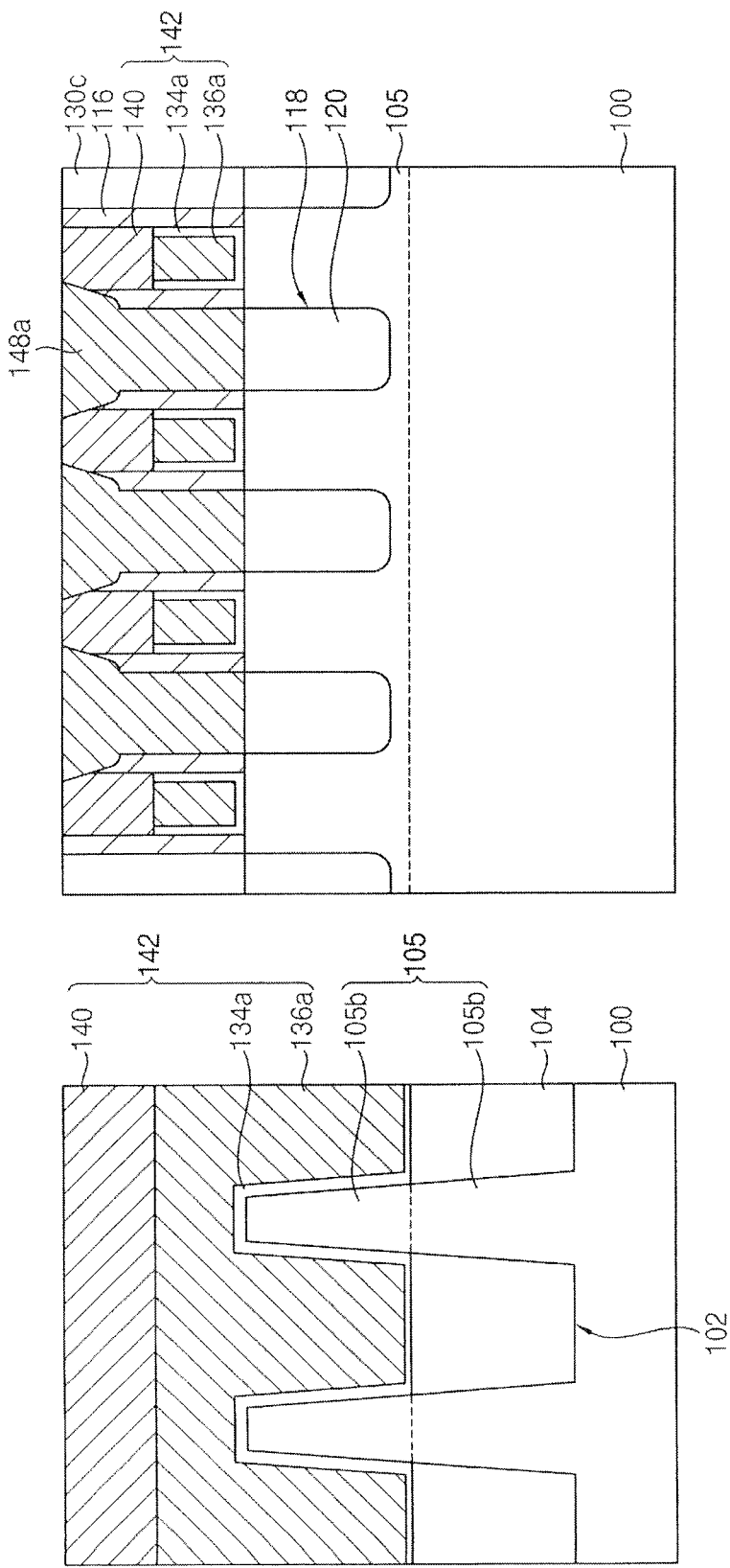

Referring to FIG. 15, the conductive layer 149 may be planarized, such that an upper surface of the first hard mask 140 is exposed, to form a contact plug 148a in the contact hole 146. Through the above processes, a fin field-effect-transistor may be formed.

As explained on the above, the second recess 150a may have a flat bottom, and a bottom surface of the first capping pattern 132c may be flat. Thus, while processes for forming the gate structure 142 are performed, the first capping pattern 132c may remain to protect the first interlayer insulation pattern 130c under the first capping pattern 132c. Thus, when the contact plug is formed by etching the first interlayer insulation pattern 130c, the contact-not-open defects may be reduced.

Furthermore, while the processes for forming the gate structure 142 are performed, the first interlayer insulation pattern 130c may be barely consumed. Thus, a height of the dummy gate structure 114a may be reduced. Thus, a thickness of the first interlayer insulation pattern 130c to be etched for forming the contact hole 146 may be reduced. Therefore, a polishing thickness of the conductive layer 148 in the planarizing process for forming the contact plug 148a may be reduced.

Figure 16:
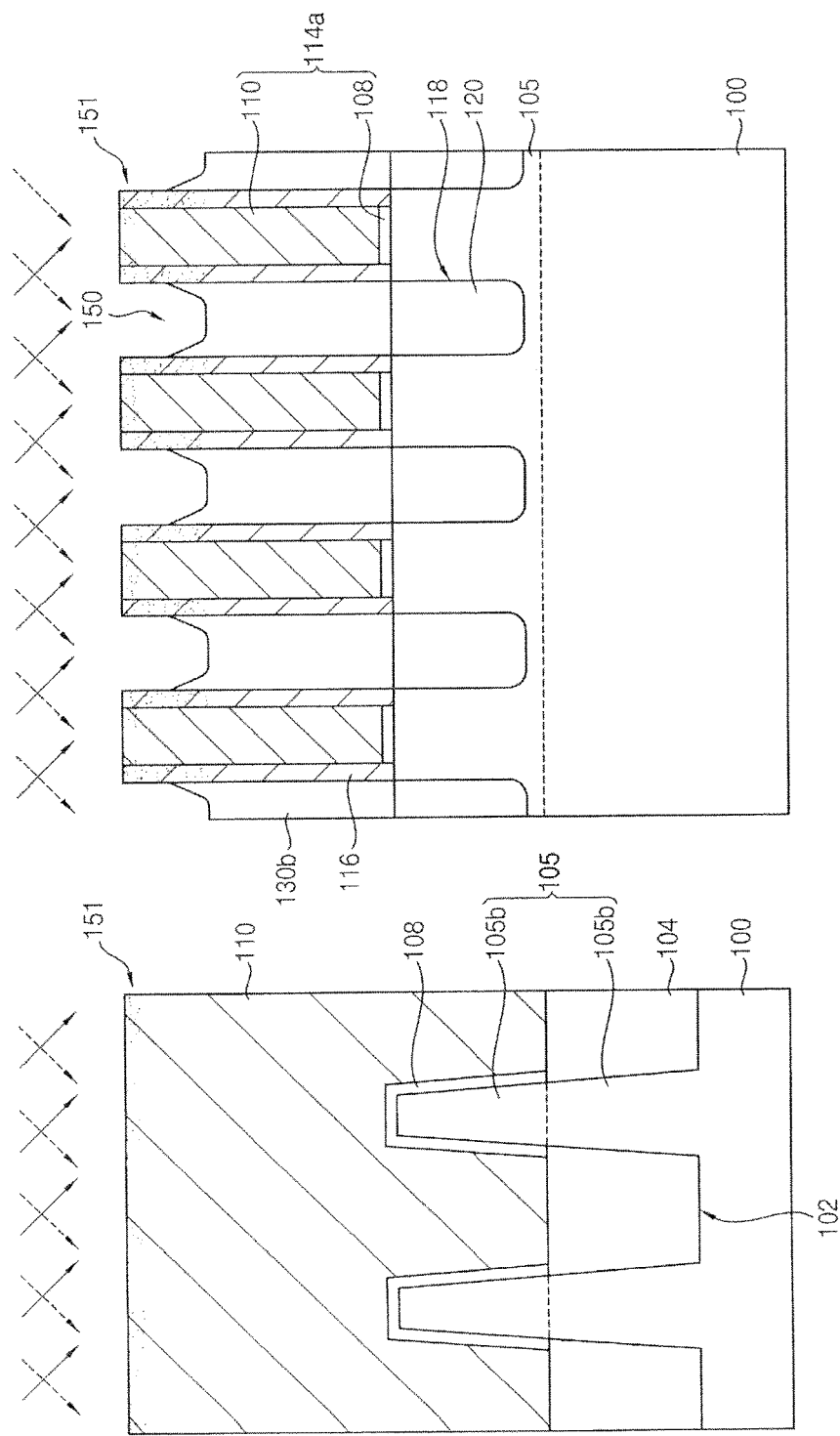
FIGS. 16 and 17 illustrate cross-sectional views of stages in a method for manufacturing a semiconductor device according to example embodiments.
Figure 17:
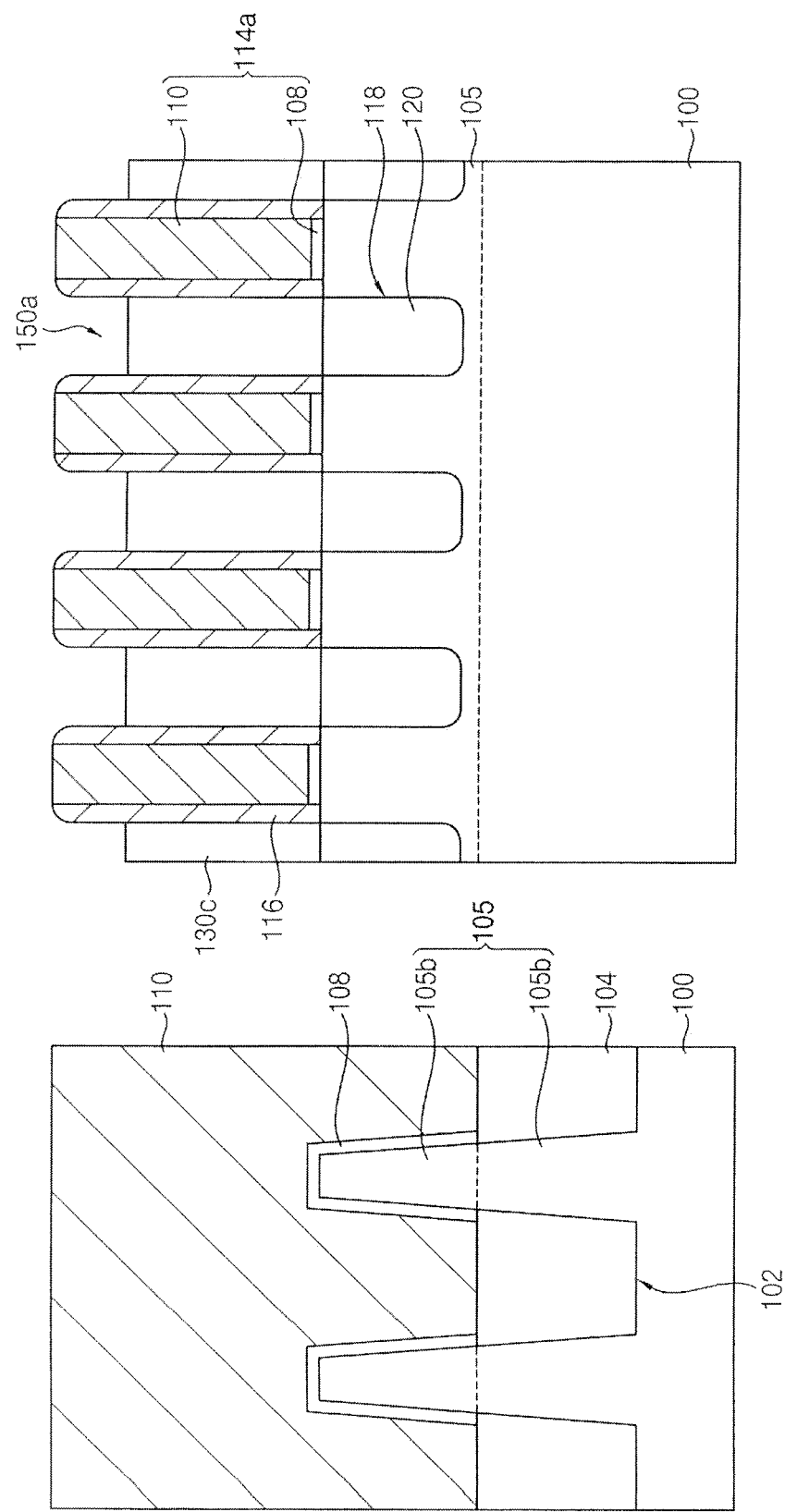

FIGS. 16 and 17 illustrate cross-sectional views of stages in a method for manufacturing a semiconductor device according to example embodiments.

The method for manufacturing a semiconductor device may be substantially the same as the method previously explained with reference to FIGS. 1 to 15 except for a process for forming a second recess.

As illustrated in FIG. 5, a preliminary second interlayer insulation pattern 130b having a round-shaped bottom between spacers 116 on dummy gate structure 114a may be formed by performing processes substantially same or similar to the processes previously explained with reference to FIGS. 1 to 5.

Referring to FIG. 16, an ion may be implanted on the dummy gate pattern 110 and the spacer 116. Thus, an ion-implanted region 151 may be formed at a surface portion of the dummy gate pattern 110 and the spacer 116.

In an implementation, the ion may be mostly doped on a sidewall of the spacer 116 while barely being doped on the preliminary second interlayer insulation pattern 130b. In an implementation, the ion may be implanted along a direction tilted to a surface of the substrate 100 by a predetermined angle. For example, the ion-implanting angle may be −45° to 45°.

The ion-implanting process may be performed to change etching characteristics of the spacer 116. For example, the spacer 116 doped with the ion may have different etching characteristics from the spacer 116 that is not doped with the ion.

In an implementation, ions and a temperature in the ion-implanting process may be substantially same as those previously explained with reference to FIG. 6.

In an implementation, a plurality of dopants different from each other may be used in the ion-implanting process. The dopants may be implanted sequentially or concurrently.

In an implementation, an annealing process may be further performed after the ion-implanting process.

Referring to FIG. 17, a bottom of the preliminary second recess 150 may be etched through a second etching process to form a second recess 150a having a substantially flat bottom. Thus, a first interlayer insulation pattern 130c having a flat upper surface may be formed.

In an implementation, the second etching process may etch the preliminary second interlayer insulation pattern 130b in a region adjacent to the spacer 116 more quickly than in a region not adjacent to the spacer 116. Therefore, a bottom of the second recess 150a may become substantially flat.

An etching selectivity between silicon oxide and silicon nitride in the second etching process may be smaller than an etching selectivity between silicon oxide and silicon nitride in the first etching process.

In an implementation, process conditions may be adjusted so that an etching ratio of the spacer 116 may be increased, or so that an etching ratio of the preliminary second interlayer insulation pattern 130b may be reduced in the second etching process than in the first etching process. In an implementation, the second etching process may be performed under conditions same as the first etching process.

Thereafter, processes substantially same as those previously explained with reference to FIGS. 8 to 15 may be performed. As a result, a fin filed-effect-transistor may be formed.

FIGS. 18 to 21 illustrate cross-sectional views of stages in a method of manufacturing a semiconductor device according to example embodiments.

The method for manufacturing a semiconductor device may be substantially same as the method previously explained with reference to FIGS. 1 to 15 except for a process for forming a second recess.

As illustrated in FIG. 4, a preliminary first interlayer insulation pattern 130a filling a gap between spacers 116 on a dummy gate structure 114a may be formed by performing processes substantially same or similar to the processes previously explained with reference to FIGS. 1 to 4.

Figure 18:
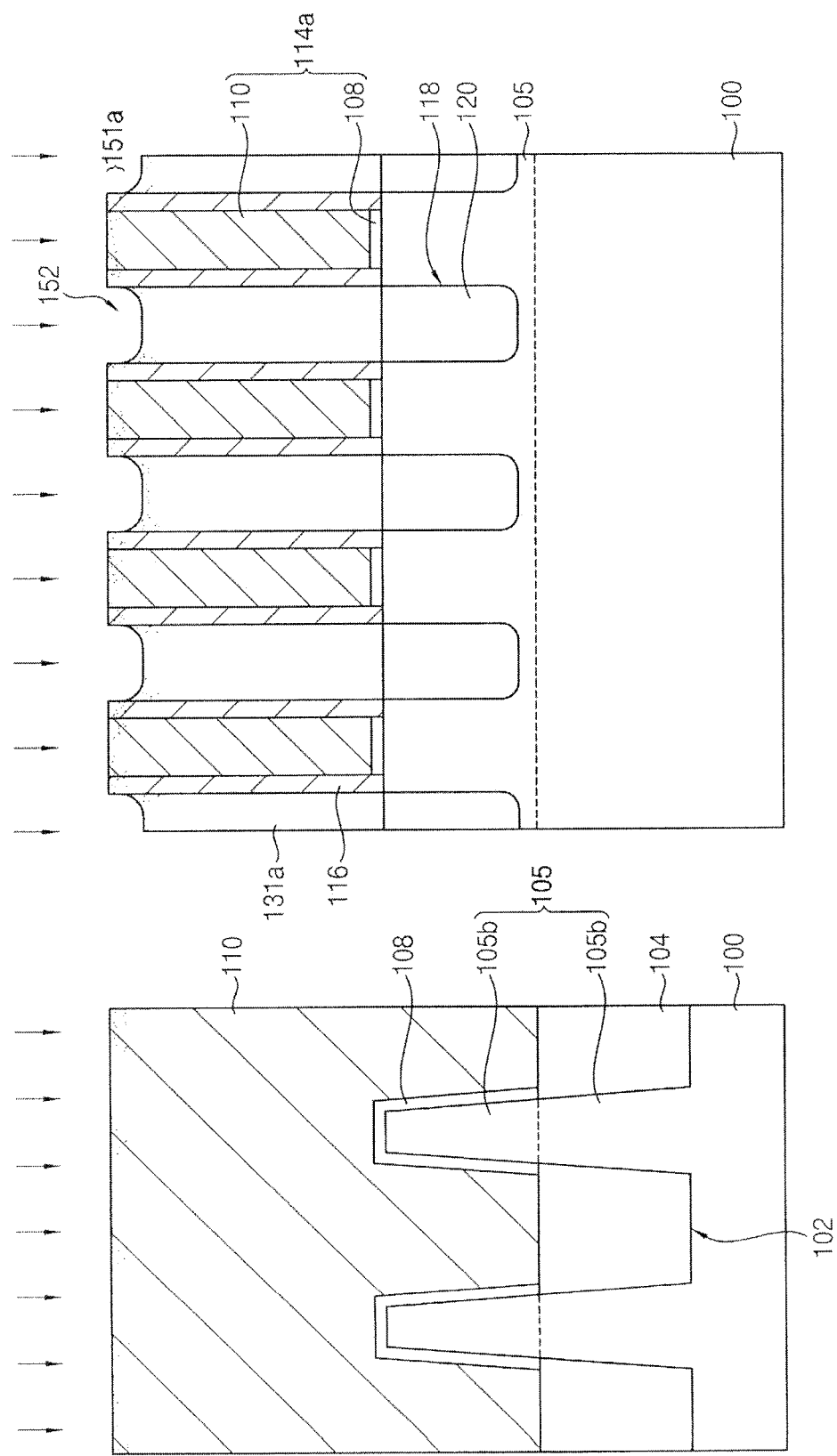
FIGS. 18 to 21 illustrate cross-sectional views of stages in a method of manufacturing a semiconductor device according to example embodiments.

Referring to FIG. 18, an upper portion of the preliminary first interlayer insulation pattern 130a may be partially etched to form a preliminary second recess 152 having a round-shaped bottom. Thus, a preliminary second interlayer insulation pattern 131a having a protrusion adjacent to the spacer 116 may be formed.

In an implementation, the preliminary second recess 152 may have a depth less than ½ of a depth of a target second recess to be formed. For example, the preliminary second recess 152 may have a depth of ⅓ to ½ of the target depth of the second recess. The etching process may be substantially same as that previously explained with reference to FIG. 5.

Thereafter, an ion may be implanted on the dummy gate pattern 110, the spacer 116 and the preliminary second recess 152. Thus, an ion-implanted region 151a may be formed under upper surfaces of the dummy gate pattern 110, the spacer 116 and the preliminary second interlayer insulation pattern 131a.

In an implementation, the ion-implanting process may be substantially same as that previously explained with reference to FIG. 6.

In an implementation, the ion-implanting process may be substantially same as that previously explained with reference to FIG. 16. As a result, an ion-implanted region may be formed only at an upper surface of the dummy gate pattern 110 and on an exposed sidewall of the spacer 116.

Figure 19:
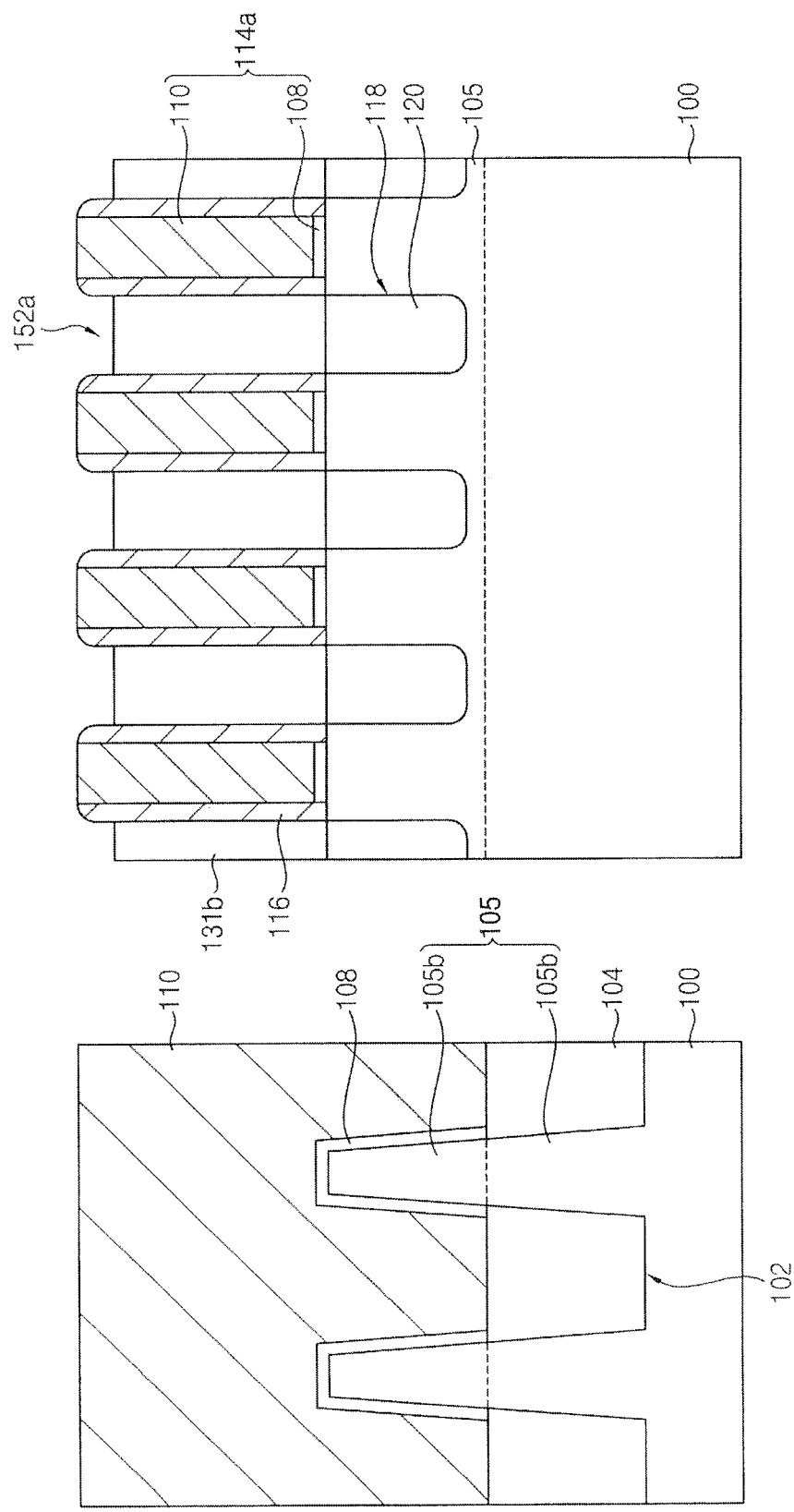

Referring to FIG. 19, a bottom of the preliminary second recess 152 may be partially etched to form a preliminary third recess 152a having a substantially flat bottom. Thus, a preliminary third interlayer insulation pattern 131b having a flat upper surface may be formed.

In an implementation, the etching process may be substantially same as that previously explained with reference to FIG. 7.

Figure 20:
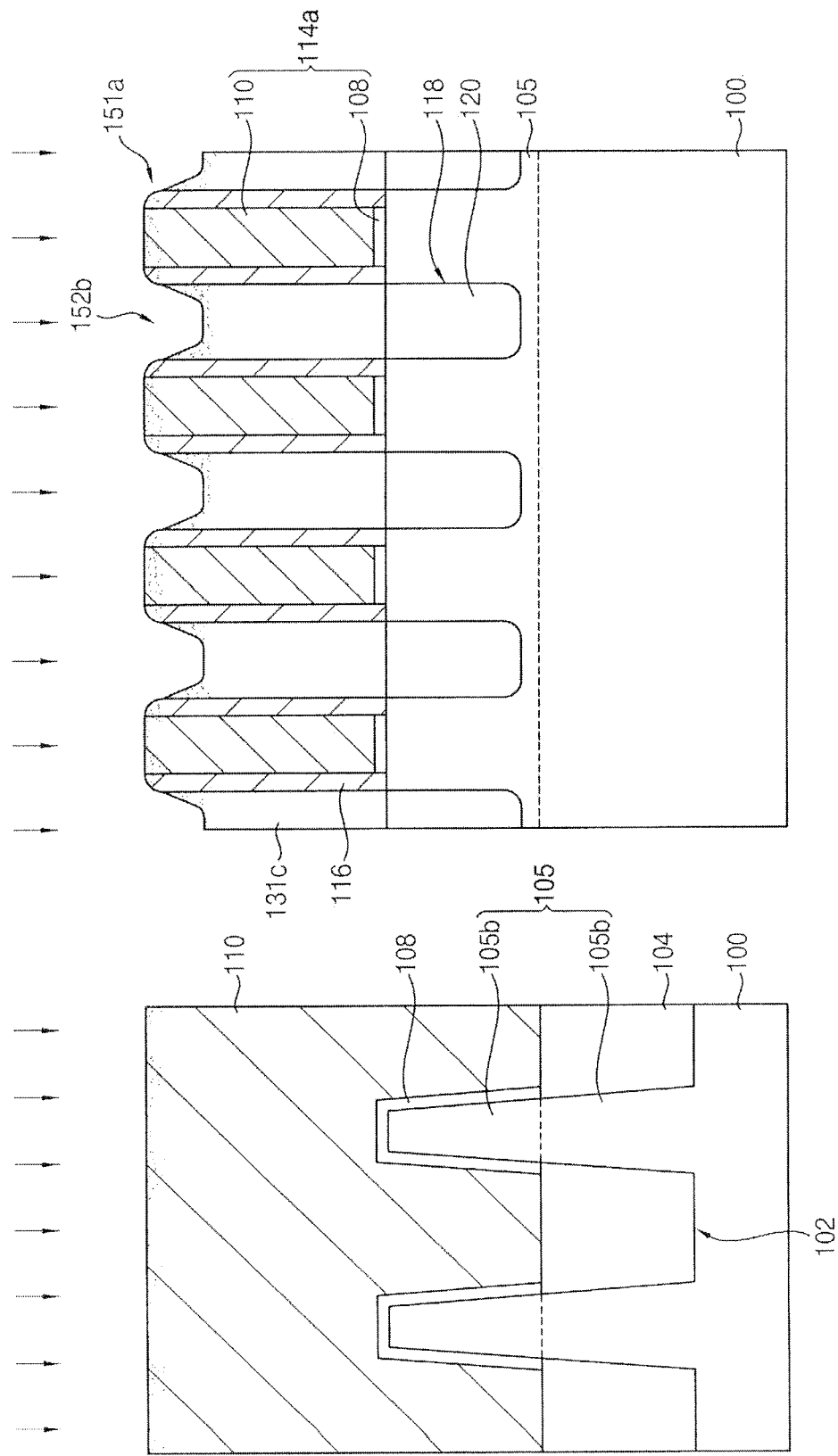

Referring to FIG. 20, an upper portion of the preliminary third interlayer insulation pattern 131b may be partially etched to form a preliminary fourth recess 152b having a round-shaped bottom. Thus, a preliminary fourth interlay insulation pattern 131c protruding nearby the spacer 116 may be formed.

In an implementation, the preliminary fourth recess 152b may have a depth that is larger than ½ of a depth of a target second recess to be formed. For example, the preliminary fourth recess 152b may have a depth of ⅔ to 9/10 of the target depth of the second recess. The etching process may be substantially same as that previously explained with reference to FIG. 5.

Thereafter, an ion may be implanted on the dummy gate pattern 110, the spacer 116 and the preliminary fourth recess 152b. Thus, an ion-implanted region 151a may be formed under upper surfaces of the dummy gate pattern 110, the spacer 116 and the preliminary third interlayer insulation pattern 131b.

In an implementation, the ion-implanting process may be substantially same as that previously explained with reference to FIG. 6.

In an implementation, the ion-implanting process may be substantially same as that previously explained with reference to FIG. 16.

Figure 21:
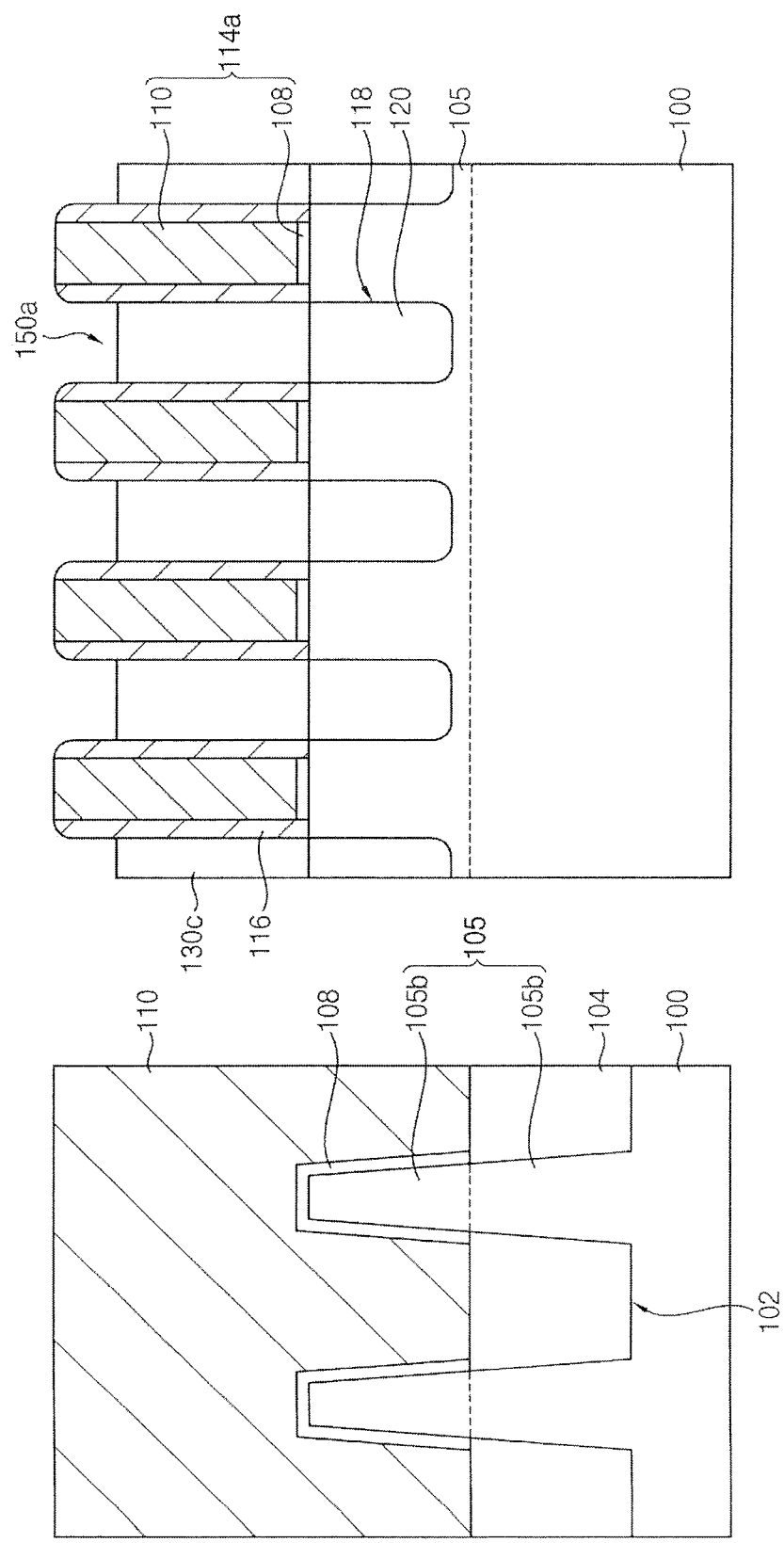

Referring to FIG. 21, a bottom of the preliminary fourth recess 152b may be etched to form a second recess 150a having a substantially flat bottom. Thus, a first interlayer insulation pattern 130c having a flat upper surface may be formed.

In an implementation, the etching process may be substantially same as that previously explained with reference to FIG. 7.

In an implementation, an etching process for forming a preliminary recess, an ion-implanting process and an etching process for forming a recess having a flat bottom may be repeatedly performed by a plurality of cycles to form the second recess 150a.

Thereafter, processes substantially same as those previously explained with reference to FIGS. 8 to 15. As a result, a fin filed-effect-transistor may be formed.

FIGS. 22 to 29 illustrate cross-sectional views of stages in a method of manufacturing a semiconductor device according to example embodiments.

A plurality of gate structures 142, a spacer 116, and a first interlayer insulation pattern 130c may be formed on a substrate 100. The spacer 116 may be disposed on a sidewall of the gate structures 142. The first interlayer insulation pattern 130c may fill a gap between the spacers 116.

In an implementation, the gate structures 142, the spacer 116, and the first interlayer insulation pattern 130c may be formed by performing processes substantially same or similar to the processes previously explained with reference to FIGS. 1 to 12. In an implementation, the gate structures 142, the spacer 116, and the first interlayer insulation pattern 130c may be formed by performing processes previously explained with reference to FIGS. 16 and 17 or processes previously explained with reference to FIGS. 18 to 21.

Figure 22:
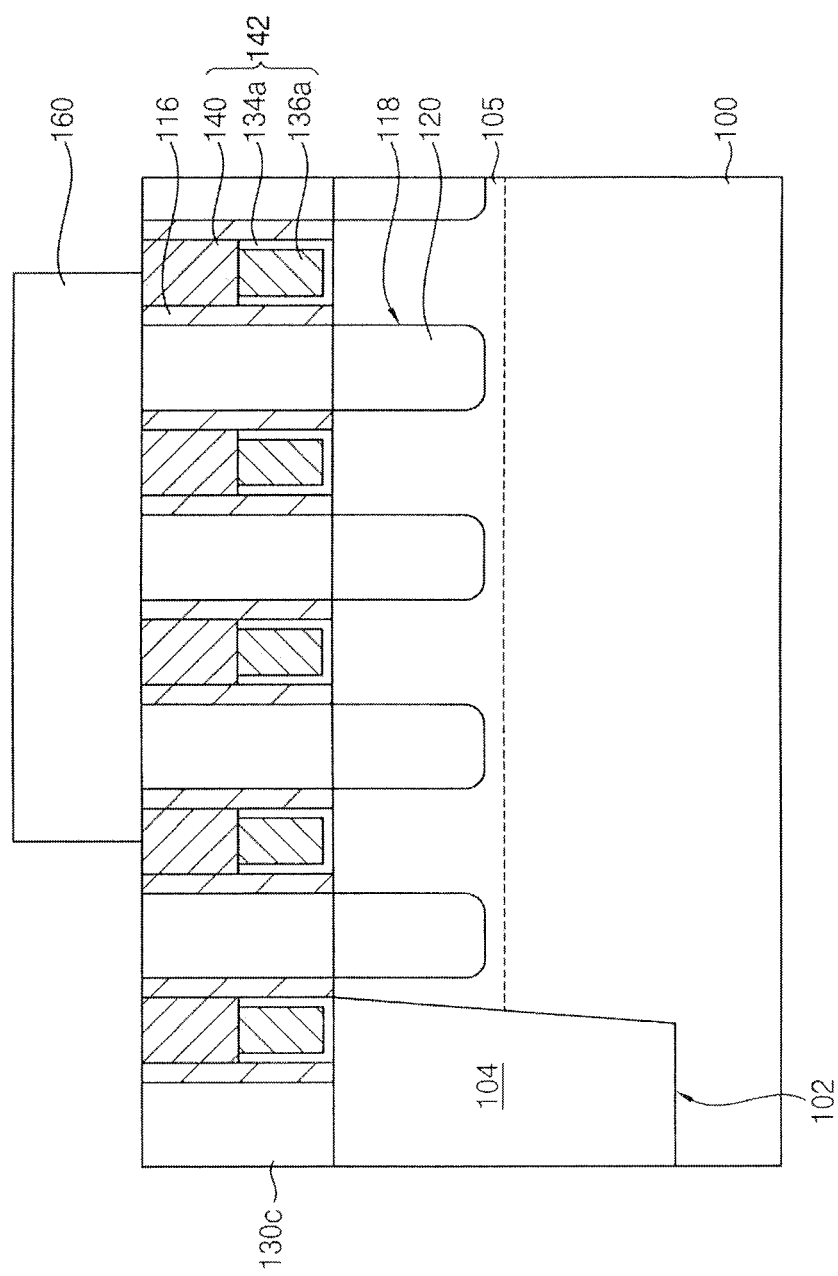
FIGS. 22 to 29 illustrate cross-sectional views of stages in a method of manufacturing a semiconductor device according to example embodiments.
Figure 23:
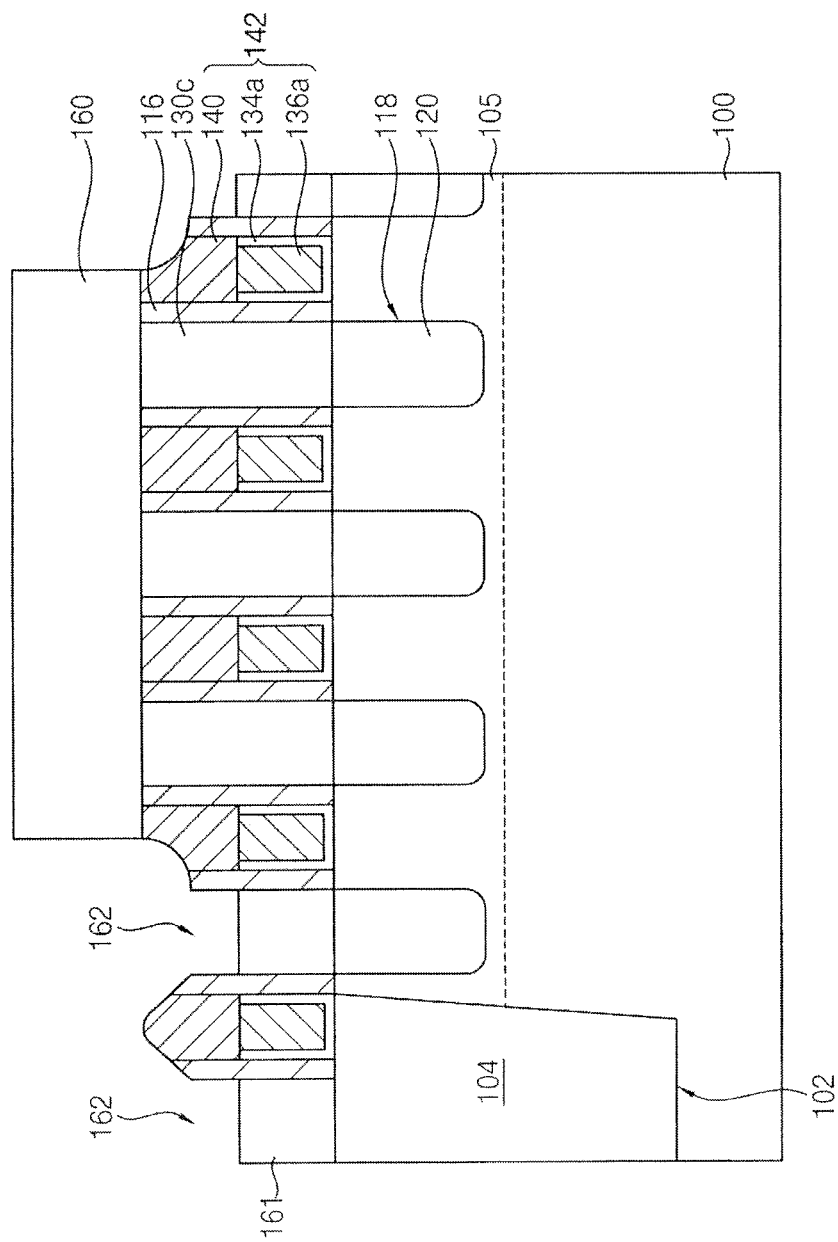

Referring to FIGS. 22 and 23, an etching mask pattern 160 may be formed on the gate structures 142, the spacer 116, and the first interlayer insulation pattern 130c. The first interlayer insulation pattern 130c may be partially etched using the etching mask pattern 160 to form an insulation pattern 161 on the substrate 100. A preliminary opening 162 may be formed on the insulation pattern 161.

In an implementation, the etching mask pattern 160 may have a shape that exposes the first interlayer insulation pattern 130c in a region where a contact hole is not formed, and covers the first interlayer insulation pattern 130c in a region where the contact hole is formed.

When the etching process is performed, the first hard mask 140 and the spacer 116 may be partially etched in a region exposed by the etching mask pattern 160.

After the etching process, the etching mask pattern 160 may be removed.

Figure 24:
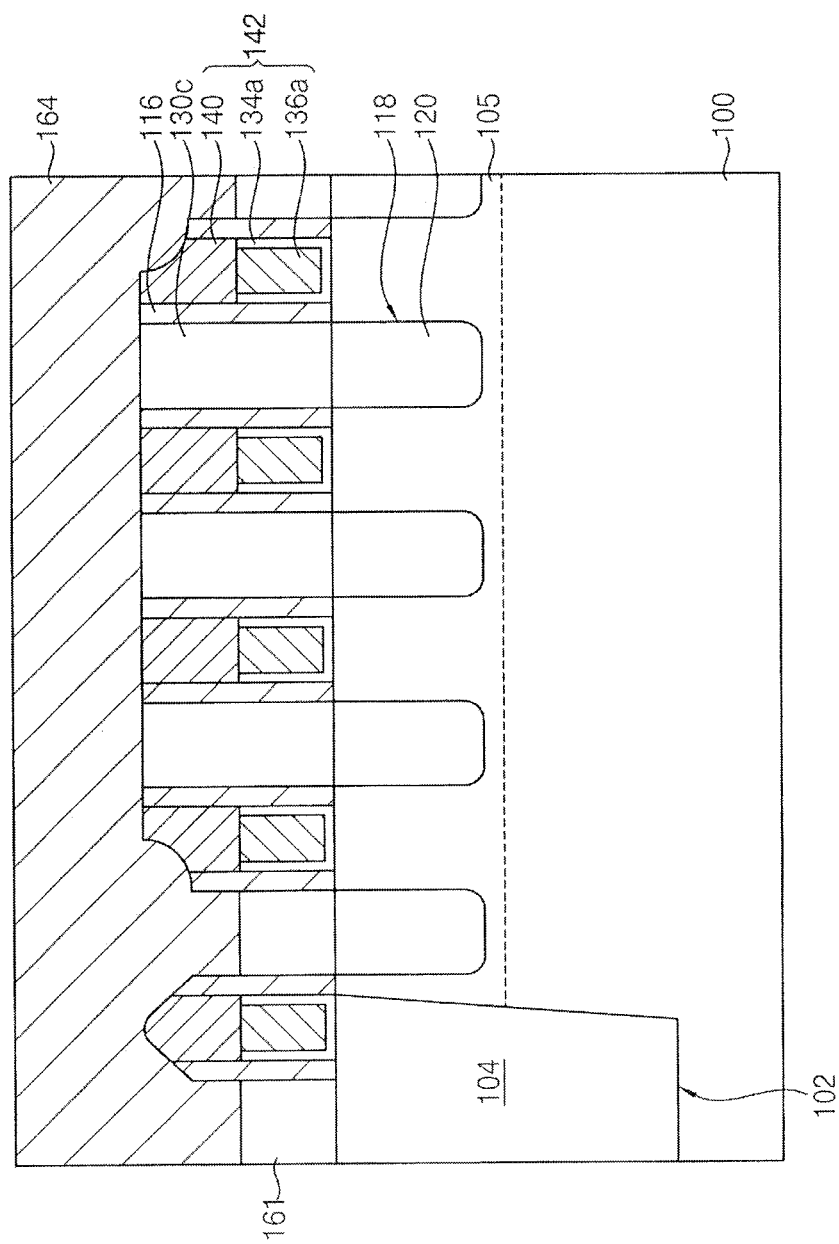

Referring to FIG. 24, a capping layer 164 may be formed on the first interlayer insulation pattern 130c and the first hard mask 140 to fill the preliminary opening 162.

In an implementation, the capping layer 164 may include silicon nitride. The capping layer 164 may be formed through a chemical vaporization deposition process or an atomic layer deposition process.

Figure 25:
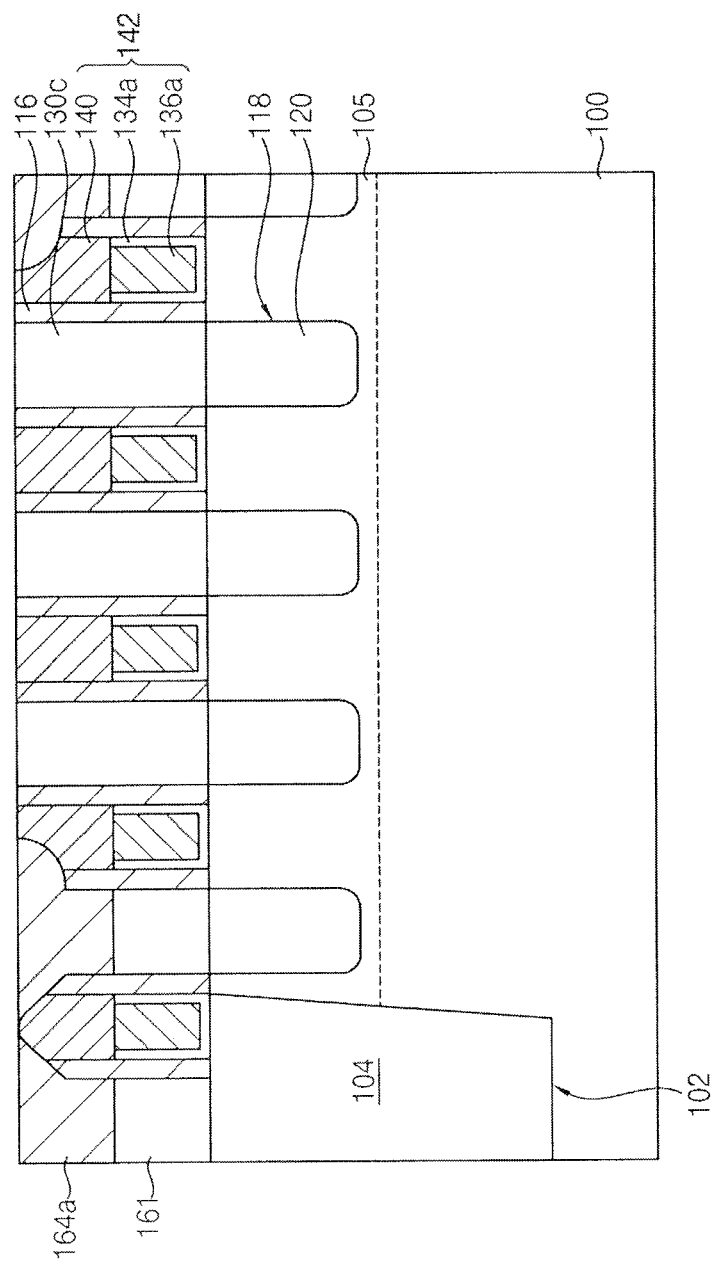

Referring to FIG. 25, the capping layer 164 may be planarized, such that an upper surface of the first interlayer insulation pattern 130c, to form a second capping pattern 164a.

Thus, the insulation pattern 161 and the second capping pattern 164a may be deposited in the region where the contact hole is not formed. Furthermore, the first interlayer insulation pattern 130c may remain in the region where the contact hole will be formed in following processes.

Figure 26:
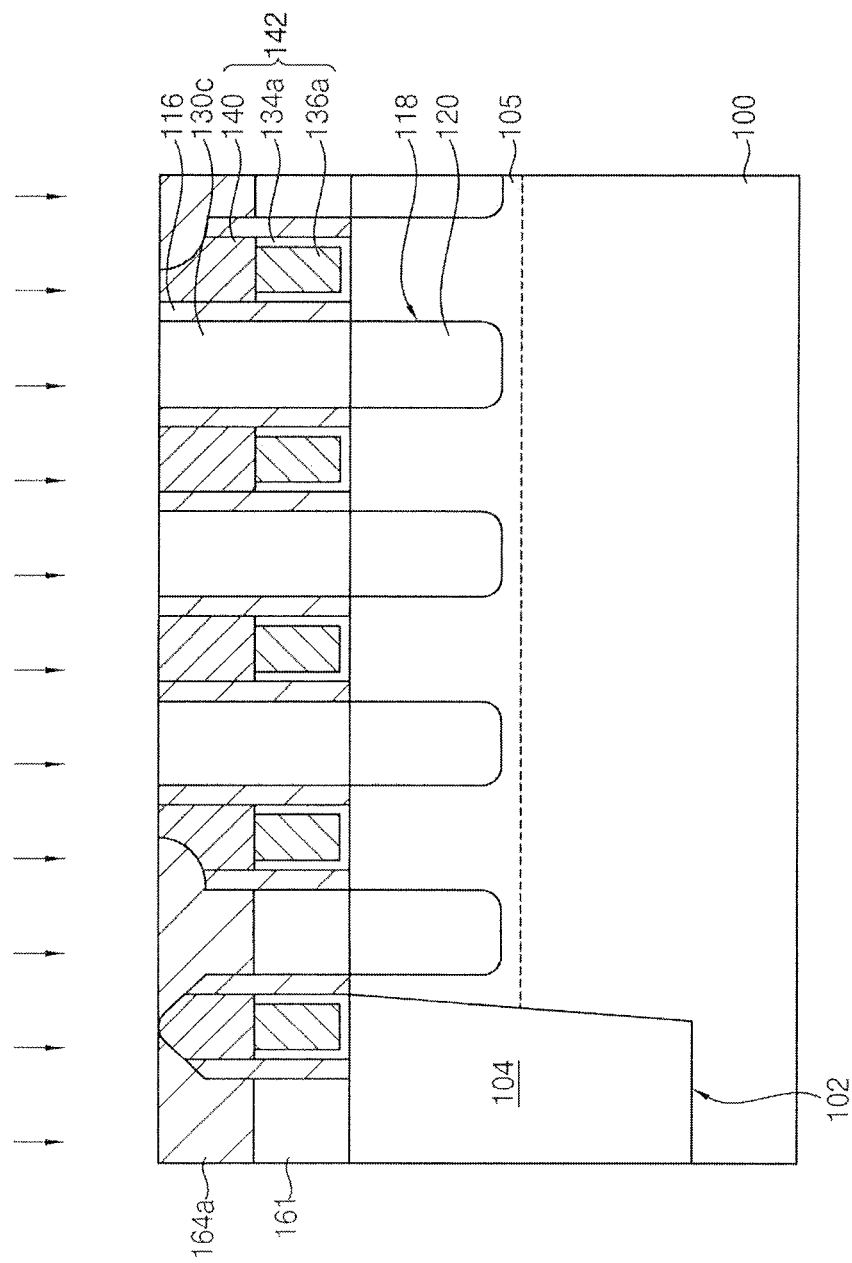

Referring to FIG. 26, an ion may be implanted on the first interlayer insulation pattern 130c and the second capping pattern 164a. Thus, an ion-implanted region may be formed in a region adjacent to upper surfaces of the first interlayer insulation pattern 130c and the second capping pattern 164a.

The ion-implanting process may be performed to change etching characteristics of the first interlayer insulation pattern 130c and/or the second capping pattern 164a. In an example embodiment, an etching selectivity between silicon oxide and silicon nitride may be increased by the ion-implanting process so that the first interlayer insulation pattern 130c may be selectively etched in following processes.

Furthermore, the ion-implanting process may remove a seam that may be generated in the second capping pattern 164a.

In an implementation, the ion may be implanted along a direction vertical to a surface of the substrate 100. In an implementation, the ion may be implanted along a direction tilted to the surface of the substrate 100. For example, the ion-implanting angle may be −45° to 45°.

In an implementation, ions and a temperature in the ion-implanting process may be substantially same as those previously explained with reference to FIG. 6.

In an implementation, a plurality of dopants different from each other may be used in the ion-implanting process. The dopants may be implanted sequentially or concurrently.

Furthermore, an annealing process may be further performed after the ion-implanting process.

Figure 27:
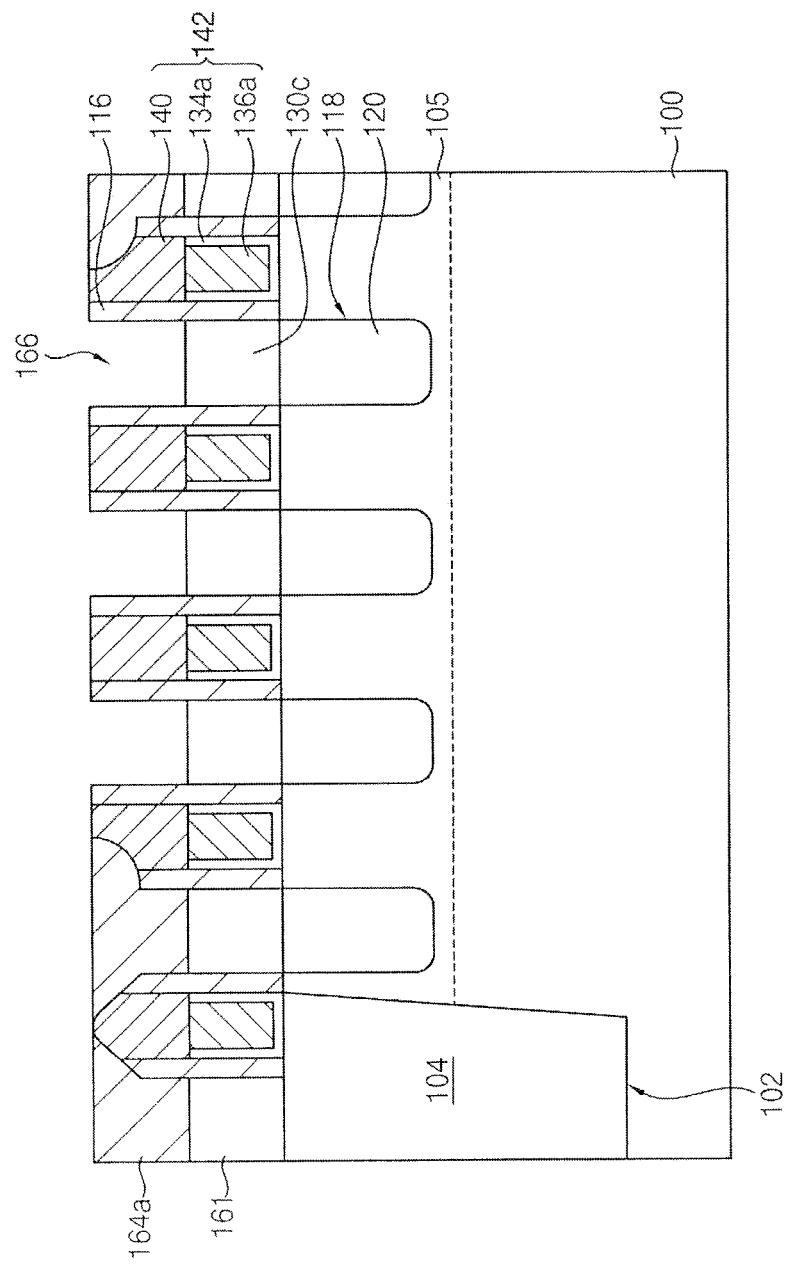

Referring to FIG. 27, the first interlayer insulation pattern 130c may be partially etched to form a preliminary first contact hole 166. The first interlayer insulation pattern 130c may partially remain on a bottom of the preliminary first contact hole 166.

The second capping pattern 164a may not include a seam. Furthermore, the second capping pattern 164 may be barely etched in the etching process. Thus, excessive etching of the second capping pattern 164a (due to the seam) may be prevented in the etching process.

Figure 28:
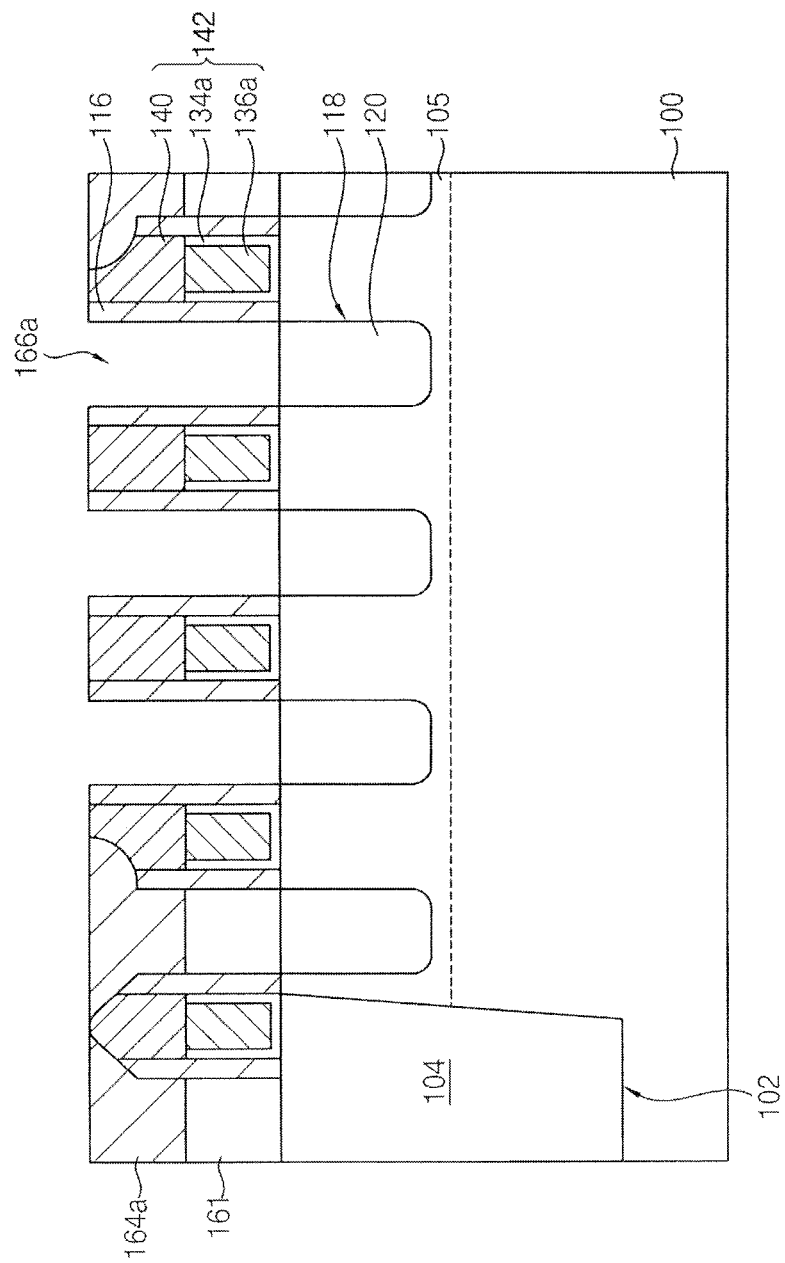

Referring to FIG. 28, the first interlayer insulation pattern 130c remaining on the bottom of the preliminary first contact hole 166 may be etched to form a first contact hole 166a. A surface of the epitaxial pattern 120 may be exposed at a bottom of the first contact hole 166a.

Figure 29:
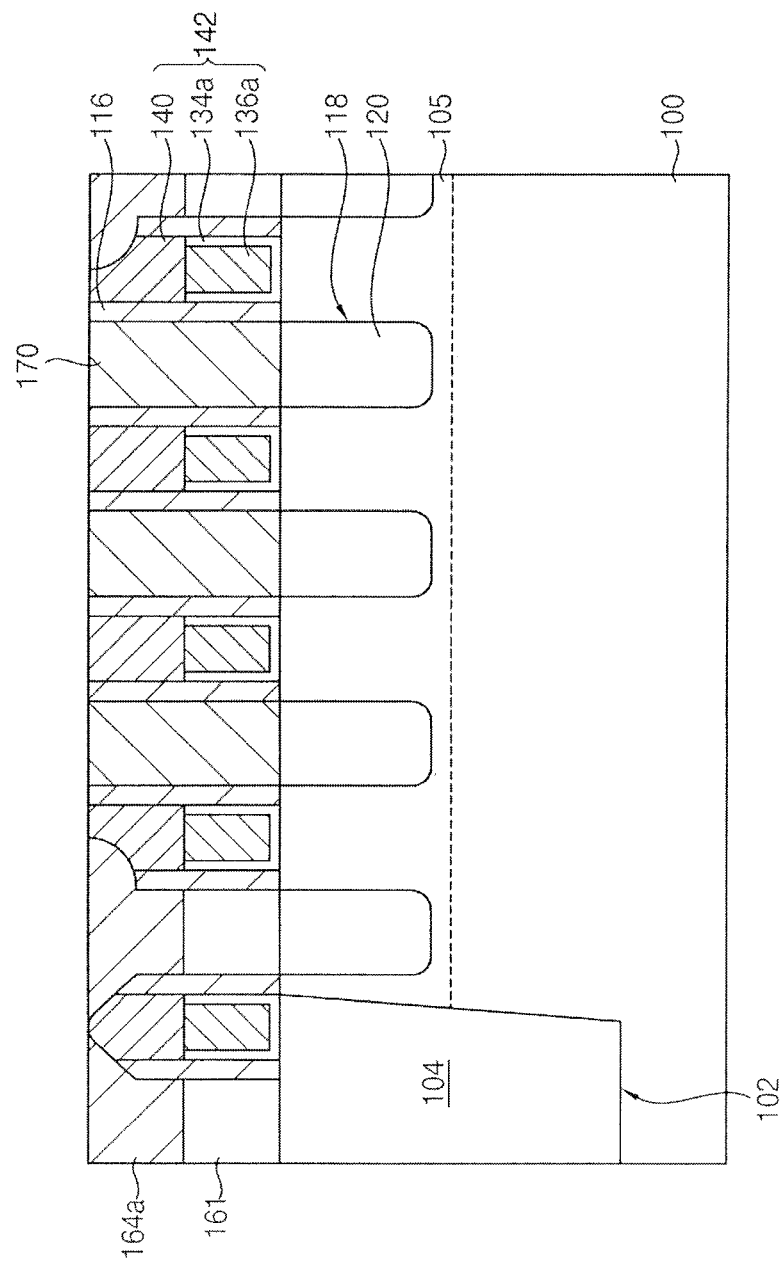

Referring to FIG. 29, a contact plug 170 may be formed in the first contact hole 166a. A process for forming the contact plug 170 may be substantially same as that previously explained with reference to FIG. 13. As a result, a fin field-effect-transistor may be formed.

Figure 30:
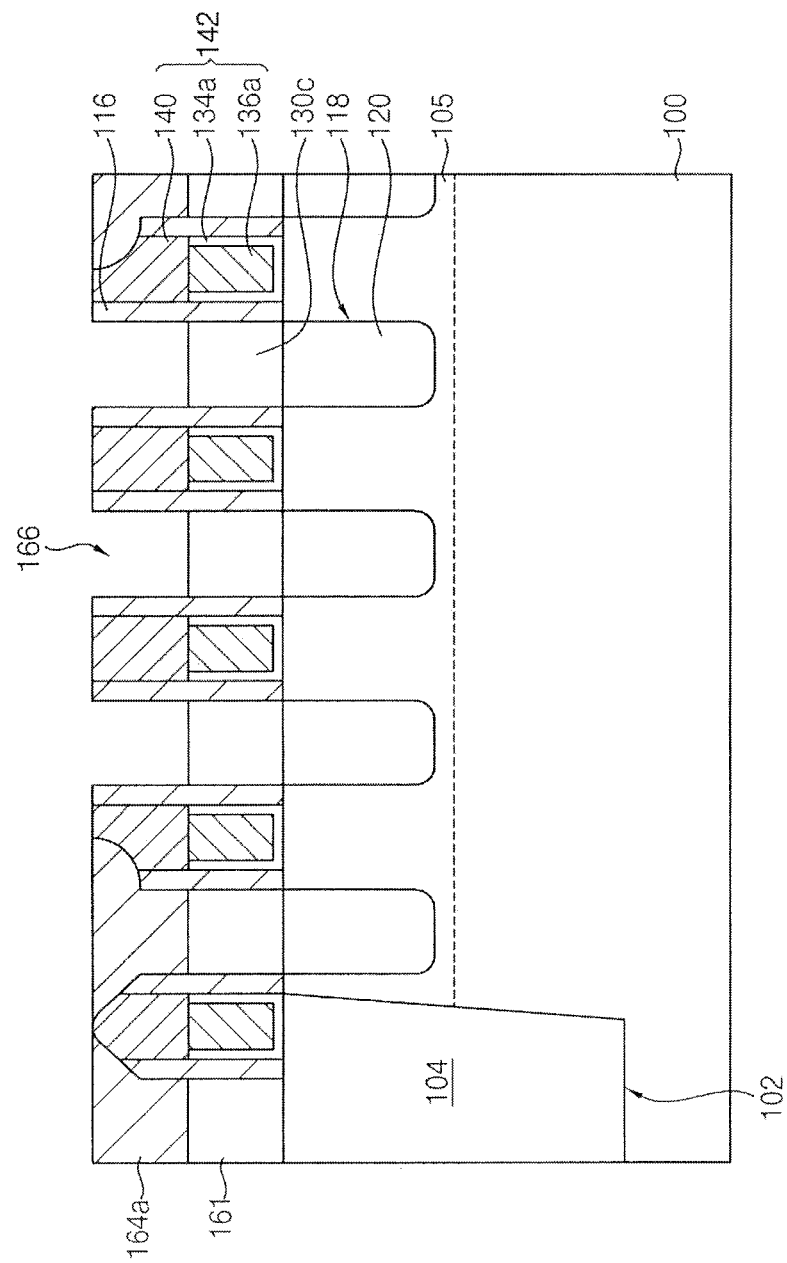
FIGS. 30 to 32 illustrate cross-sectional views of stages in a method of manufacturing a semiconductor device according to example embodiments.
Figure 31:
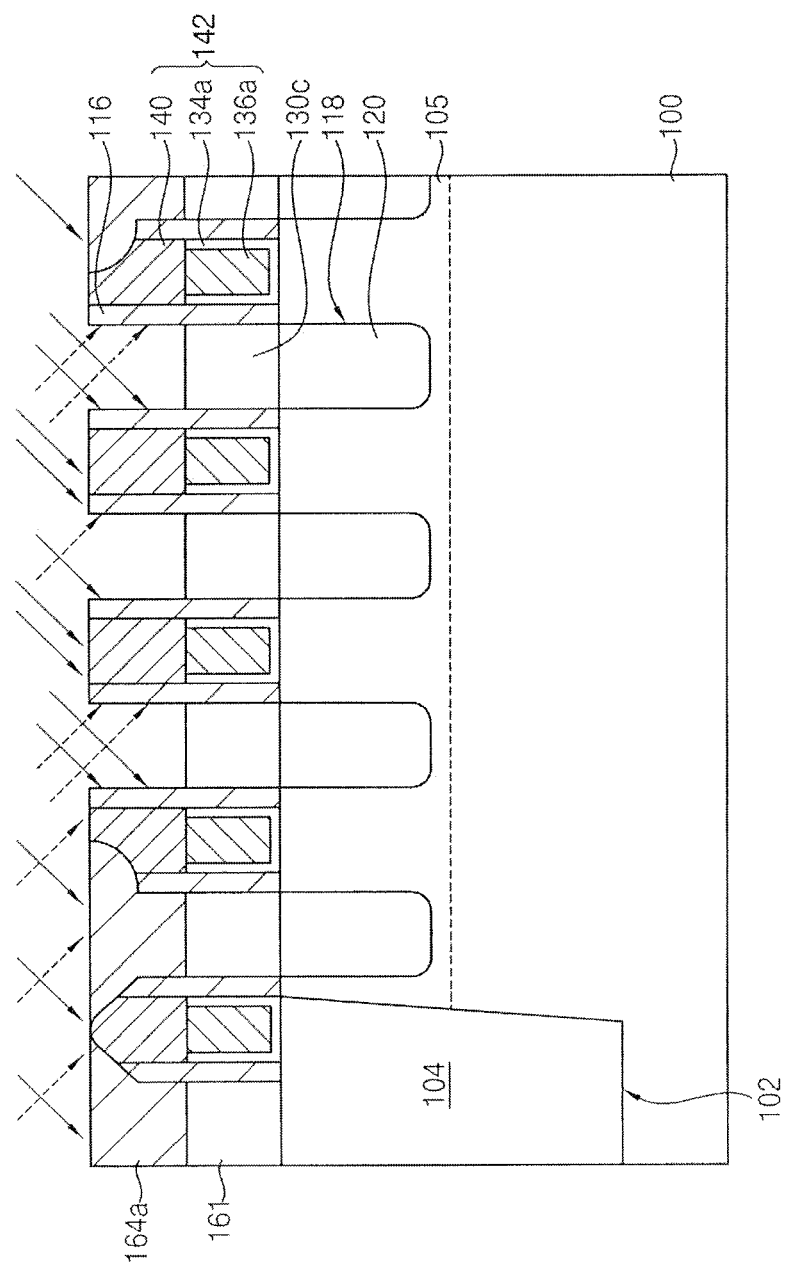
Figure 32:
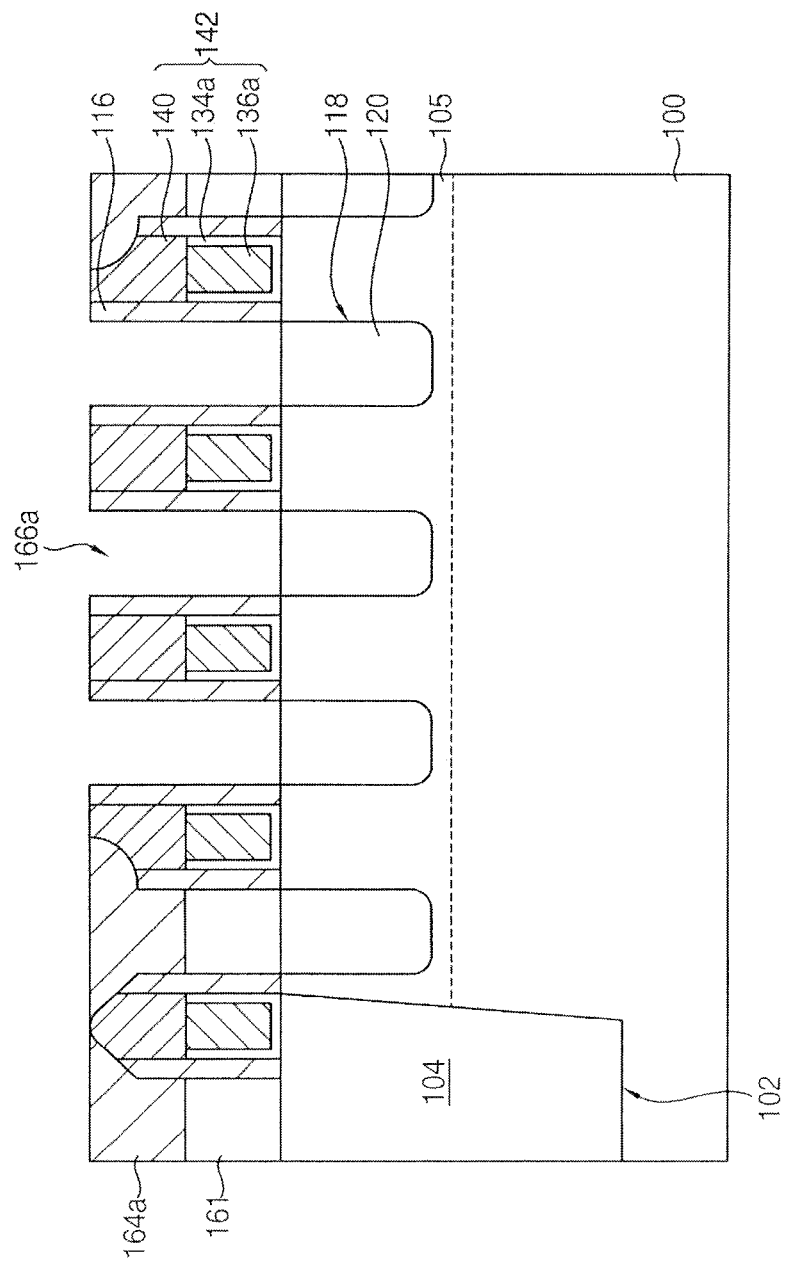

FIGS. 30 to 32 illustrate cross-sectional view of stages in a method of manufacturing a semiconductor device according to example embodiments.

A plurality of gate structures 142, a spacer 116, and a first interlayer insulation pattern 130c may be formed on a substrate 100. The spacer 116 may be disposed on a sidewall of the gate structures 142. The first interlayer insulation pattern 130c may fill a gap between the spacers 116.

In an implementation, the gate structures 142, the spacer 116, and the first interlayer insulation pattern 130c may be formed by performing processes substantially same or similar to the processes previously explained with reference to FIGS. 1 to 12. In an implementation, the gate structures 142, the spacer 116, and the first interlayer insulation pattern 130c may be formed by performing processes previously explained with reference to FIGS. 16 and 17 or processes previously explained with reference to FIGS. 18 to 21.

Thereafter, an insulation pattern 161 and a second capping pattern 164a may be deposited in a region, where a contact hole is not formed, through processes same as those previously explained with reference to FIGS. 22 to 25.

Referring to FIG. 30, the first interlayer insulation pattern 130c may be partially etched to form a preliminary first contact hole 166. The first interlayer insulation pattern 130c may partially remain on a bottom of the preliminary first contact hole 166.

A sidewall of the spacer 116 may be exposed by the preliminary first contact hole 166.

Referring to FIG. 31, an ion may be implanted on the first interlayer insulation pattern 130c, the first hard mask 140, the second capping pattern 164a and the sidewall of the spacer 116 exposed through the preliminary first contact hole 166.

In an implementation, the ion may be implanted along a direction tilted to a surface of the substrate 100. For example, the ion-implanting angle may be −45° to 45°.

In an implementation, the ion may be implanted on the sidewall of the spacer 116 exposed through the preliminary first contact hole 166 while the ion may be barely implanted on the first interlayer insulation pattern 130c. The ion-implanting process may be performed to change etching characteristics of the spacer 116 and the first hard mask 140. For example, the spacer 116 doped with the ion may have different etching characteristics from the spacer 116 that is not doped with the ion.

In an implementation, the ion may be implanted along a direction vertical to the surface of the substrate 100. Thus, an ion-implanted region may be formed under upper surfaces of the first interlayer insulation pattern 130c and the first hard mask 140.

In an implementation, ions and a temperature in the ion-implanting process may be substantially same as those previously explained with reference to FIG. 6.

In an implementation, a plurality of dopants different from each other may be used in the ion-implanting process. The dopants may be implanted sequentially or concurrently.

In an implementation, an annealing process may be further performed after the ion-implanting process.

Referring to FIG. 32, the first interlayer insulation pattern 130c remaining on the bottom of the preliminary first contact hole 166 may be etched to form a first contact hole 166a. A surface of the epitaxial pattern 120 may be exposed at a bottom of the first contact hole 166a.

In the etching process for forming the first contact hole 166a, the second capping pattern 164a may be barely etched. Thus, excessive etching of the second capping pattern 164a may be prevented in the etching process.

Thereafter, a contact plug may be formed in the first contact hole 166a by performing a process same as that previously explained with reference to FIG. 13.

As explained in the above, semiconductor devices according to example embodiments may be used for a memory device or a logic device, which includes a transistor.

The embodiments may provide methods of manufacturing a semiconductor device including transistors.

The embodiments may provide a method of manufacturing a semiconductor device including a fin field-effect transistor having a high performance.

According to example embodiments, a semiconductor device including a fin field-effect-transistor having a superior electrical characteristic may be manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming dummy gate structures on a substrate;
   forming spacers on sidewalls of the dummy gate structures;
   forming a preliminary first interlayer insulation pattern to fill a gap between adjacent spacers;
   etching an upper portion of the preliminary first interlayer insulation pattern through a first etching process to form a preliminary second interlayer insulation pattern;
   implanting an ion on the dummy gate structures, the spacers, and the preliminary second interlayer insulation pattern through an ion-implanting process;
   etching an upper portion of the preliminary second interlayer insulation pattern through a second etching process to form an interlayer insulation pattern having a flat upper surface; and
   forming a capping pattern on the interlayer insulation pattern to fill the gap between the spacers,
   wherein an etching selectivity between silicon oxide and silicon nitride in the second etching process is smaller than an etching selectivity between silicon oxide and silicon nitride in the first etching process.

2. The method as claimed in claim 1, wherein an upper surface of the preliminary second interlayer insulation pattern has a shape such that a region thereof adjacent to the spacers protrudes further in a direction away from the substrate that a region thereof distal to the spacers.

3. The method as claimed in claim 1, wherein an etching gas used in each of the first etching process and the second etching process includes HF and $NH_3$.

4. The method as claimed in claim 3, wherein, in each of the first etching process and the second etching process:
   a chamber pressure is 1.8 to 3 Torr,
   a gas ratio of HF and $NH_3$ is 2:1 to 20:1,
   a number of cycles is 1 to 10, and
   a process time is 1 to 10 seconds.

5. The method as claimed in claim 1, wherein the ion implanted in the ion-implanting process includes an ion of boron, silicon, arsenic, phosphorus, argon, nitrogen, carbon, oxygen, $BF_2$, fluorine, hydrogen, helium, germanium, gallium, krypton, or xenon.

6. The method as claimed in claim 1, wherein the ion-implanting process includes sequentially or concurrently implanting a plurality of ions different from each other.

7. The method as claimed in claim 1, wherein the ion-implanting process includes forming an ion-implanted region under surfaces of the dummy gate structure and the preliminary second interlayer insulation pattern.

8. The method as claimed in claim 1, wherein the ion-implanting process includes forming an ion-implanted region under a surface of the dummy gate structure and at a sidewall of the spacer.

9. The method as claimed in claim 1, wherein an etching characteristic of at least one of the preliminary second interlayer insulation pattern and the spacer is changed through the ion-implanting process.

10. The method as claimed in claim 1, wherein the first etching process, the ion-implanting process, and the second etching process are repeated by a plurality of cycles before forming the capping pattern.

11. The method as claimed in claim 1, further comprising replacing the dummy gate structures with gate structures after forming the capping pattern.

12. The method as claimed in claim 11, wherein replacing the dummy gate structures with the gate structures includes:
   removing the dummy gate structures to form an opening;
   forming gate structure layers in the opening and on the capping pattern; and
   planarizing the gate structure layers and the capping pattern, such that the interlayer insulation pattern is exposed, to form the gate structures in the opening.

13. The method as claimed in claim 11, further comprising forming a contact plug between the gate structures.

14. A method of manufacturing a semiconductor device, the method comprising:
   forming dummy gate structures on a substrate;
   forming a preliminary first interlayer insulation pattern to fill a gap between the dummy gate structures;
   etching an upper portion of the preliminary first interlayer insulation pattern to form a preliminary recess having a round-shaped bottom and a preliminary second interlayer insulation pattern under the preliminary recess through a first etching process;
   implanting an ion on the dummy gate structures and the preliminary second interlayer insulation pattern;
   etching a portion of the preliminary second interlayer insulation pattern through a second etching process to form a recess having a flat bottom and an interlayer insulation pattern under the recess;
   forming a capping pattern on the interlayer insulation pattern; and
   replacing the dummy gate structures with gate structures,
   wherein an etching selectivity between silicon oxide and silicon nitride in the second etching process is smaller than an etching selectivity between silicon oxide and silicon nitride in the first etching process.

15. The method as claimed in claim 14, wherein replacing the dummy gate structures with the gate structures includes:
   removing the dummy gate structures to form an opening;
   forming gate structure layers in the opening and on the capping pattern; and
   planarizing the gate structure layers and the capping pattern, such that the interlayer insulation pattern is exposed, to form the gate structures in the opening.

16. A method of manufacturing a semiconductor device, the method comprising:
   forming gate structures on a substrate;
   forming a preliminary interlayer insulation pattern including silicon oxide to fill a gap between the gate structures;
   forming a mask pattern on the gate structures and the preliminary interlayer insulation pattern to cover a contact-forming region;
   partially etching an upper portion of the preliminary interlayer insulation pattern using the mask pattern as an etching mask to form a recess and an interlayer insulation pattern under the recess;
   forming a capping pattern including silicon nitride on the interlayer insulation pattern to fill the recess;
   implanting an ion on the gate structures, the interlayer insulation pattern, and the capping pattern so that an etching selectivity between silicon oxide and silicon nitride is increased; and etching the interlayer insulation pattern doped with an ion to form a contact hole.

17. The method as claimed in claim 16, further comprising etching a portion of the interlayer insulation pattern before implanting the ion.

18. The method as claimed in claim 16, wherein the ion includes an ion of boron, silicon, arsenic, phosphorus, argon, nitrogen, carbon, oxygen, $BF_2$, fluorine, hydrogen, helium, germanium, gallium, krypton, or xenon.

* * * * *